US010749115B2

(12) United States Patent
Denker et al.

(10) Patent No.: US 10,749,115 B2
(45) Date of Patent: Aug. 18, 2020

(54) N-DOPED SEMICONDUCTING MATERIAL COMPRISING POLAR MATRIX AND METAL DOPANT

(71) Applicant: Novaled GmbH, Dresden (DE)

(72) Inventors: Ulrich Denker, Dresden (DE); Carsten Rothe, Dresden (DE); Volodymyr Senkovskyy, Dresden (DE); Tomas Kalisz, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

(21) Appl. No.: 15/739,143

(22) PCT Filed: Jun. 22, 2016

(86) PCT No.: PCT/EP2016/064438
§ 371 (c)(1),
(2) Date: Dec. 21, 2017

(87) PCT Pub. No.: WO2016/207228
PCT Pub. Date: Dec. 29, 2016

(65) Prior Publication Data
US 2019/0036032 A1    Jan. 31, 2019

(30) Foreign Application Priority Data

Jun. 23, 2015   (EP) ..................................... 15173437
Jun. 23, 2015   (EP) ..................................... 15173438

(51) Int. Cl.
*H01L 51/50*       (2006.01)
*H01L 51/00*       (2006.01)
(Continued)

(52) U.S. Cl.
CPC ........ *H01L 51/0058* (2013.01); *H01L 51/002* (2013.01); *H01L 51/005* (2013.01);
(Continued)

(58) Field of Classification Search
CPC ............... H01L 51/006; H01L 51/0067; H01L 51/5004; H01L 51/5092; H01L 51/0073;
(Continued)

(56) References Cited

U.S. PATENT DOCUMENTS 7,776,455 B2   8/2010   Gerhard et al.
8,686,403 B2   4/2014   Kang et al.
(Continued)

FOREIGN PATENT DOCUMENTS

CN    102229623 A    11/2011
CN    104513374 A    4/2015
(Continued)

OTHER PUBLICATIONS

PCT International Search Report and Written Opinion for PCT Application No. PCT/EP2016/064438 dated Aug. 30, 2016 (9 pages).

(Continued)

*Primary Examiner* — Thanh T Nguyen
(74) *Attorney, Agent, or Firm* — Eversheds Sutherland (US) LLP

(57) ABSTRACT

The invention relates to a semiconducting material comprising (i) in substantially elemental form, an electropositive element selected from alkaline metals, alkaline earth metals, rare earth metals, and transition metals, and (ii) at least one first compound which is a compound comprising at least one polar group selected from phosphine oxide group or diazole group; a process for manufacturing the semiconducting material; an electronic device comprising a cathode, an anode and the semiconducting material.

30 Claims, 2 Drawing Sheets

(51) Int. Cl.
*H01L 51/52* (2006.01)
*H01L 51/56* (2006.01)

(52) U.S. Cl.
CPC ........ *H01L 51/006* (2013.01); *H01L 51/0034* (2013.01); *H01L 51/0052* (2013.01); *H01L 51/0059* (2013.01); *H01L 51/0067* (2013.01); *H01L 51/0072* (2013.01); *H01L 51/0073* (2013.01); *H01L 51/5004* (2013.01); *H01L 51/5092* (2013.01); *H01L 51/5234* (2013.01); *H01L 51/56* (2013.01); *H01L 51/001* (2013.01); *H01L 51/5008* (2013.01); *H01L 51/5076* (2013.01); *H01L 51/5278* (2013.01); *H01L 2251/301* (2013.01); *H01L 2251/305* (2013.01); *H01L 2251/308* (2013.01); *H01L 2251/552* (2013.01)

(58) Field of Classification Search
CPC . H01L 51/0052; H01L 51/56; H01L 51/5234; H01L 51/005; H01L 51/0072; H01L 51/0059; H01L 51/0058; H01L 51/0034; H01L 51/002; H01L 51/001; H01L 2251/308; H01L 51/5076; H01L 51/5278; H01L 51/5008; H01L 2251/552; H01L 2251/305; H01L 2251/301
See application file for complete search history.

(56) References Cited

U.S. PATENT DOCUMENTS

| | | | |
|---|---|---|---|
| 9,356,242 | B2 | 5/2016 | Kaiser et al. |
| 2008/0238307 | A1 | 10/2008 | Tobise et al. |
| 2012/0119191 | A1* | 5/2012 | Dorok .................. C07F 9/65583 257/40 |
| 2012/0140439 | A1* | 6/2012 | Hasegawa ............. C07F 9/5329 362/84 |
| 2014/0353649 | A1 | 12/2014 | Dorok et al. |
| 2015/0295184 | A1* | 10/2015 | Kaiser ................. H01L 51/0067 257/40 |

FOREIGN PATENT DOCUMENTS

| | | |
|---|---|---|
| CN | 104518106 A | 4/2015 |
| CN | 104518138 A | 4/2015 |
| EP | 1486551 A1 | 12/2004 |
| EP | 2452946 A1 | 5/2012 |
| EP | 2860782 A1 | 4/2015 |
| JP | 2002063989 A | 2/2002 |
| JP | 2006073581 A | 3/2006 |
| JP | 2008-270729 A | 11/2008 |
| JP | 2009-076508 A | 4/2009 |
| KR | 10-2015-0037605 | 4/2015 |
| WO | 2015/052284 A1 | 4/2015 |

OTHER PUBLICATIONS

EP Search Report for EP Application No. 15173437.3 dated Dec. 9, 2015 (4 pages).
EP Search Report for EP Application No. 15173438.1 dated Dec. 2, 2015 (4 pages).
Jeong et al., "Dibenzofuran Derivative as High Triplet Energy Host Material for High Efficiency in Deep Blue Phosphorescent Organic Light-Emitting Diodes," Organic Electronics, 2012, 13:1141-1145.
Sapochak et al., "Design Strategies for Achieving High Triplet Energy Electron Transporting Host Materials for Blue Electrophosphorescent," Proc of SPIE, vol. 6333, 63330F-1-63330F-13.
Chinese Office Action for CN Application No. 201680037174.2 dated Jan. 4, 2019 (English translation, 5 pages).
Chinese Office Action for CN Application No. 201680043294.3 dated Sep. 16, 2019 (English translation, 13 pages).
Japan Office Action for JP Application No. 2017-566730 dated May 19, 2020.

\* cited by examiner

N-DOPED SEMICONDUCTING MATERIAL COMPRISING POLAR MATRIX AND METAL DOPANT

CROSS REFERENCE TO RELATED APPLICATIONS

This application is a U.S. national stage application of PCT/EP2016/064438, filed Jun. 22, 2016, which claims priority to European Application No. 15173438.1, filed Jun. 23, 2015, and European Application No. 15173437.3, filed Jun. 23, 2015. The contents of these applications are incorporated herein by reference.

The present invention concerns organic semiconducting material with improved electrical properties, process for its preparation, electronic device utilizing the improved electrical properties of the inventive semiconducting material, particularly the device comprising this organic semiconducting material in an electron transporting and/or electron injecting layer, and electron transport matrix compound applicable in semiconducting material of present invention.

I. BACKGROUND OF THE INVENTION

Among the electronic devices comprising at least a part based on material provided by organic chemistry, organic light emitting diodes (OLEDs) have a prominent position. Since the demonstration of efficient OLEDs by Tang et al. in 1987 (C. W. Tang et al., Appl. Phys. Lett. 51 (12), 913 (1987)), OLEDs developed from promising candidates to high-end commercial displays. An OLED comprises a sequence of thin layers substantially made of organic materials. The layers typically have a thickness in the range of 1 nm to 5 μm. The layers are usually framed either by means of vacuum deposition or from a solution, for example by means of spin coating or jet printing.

OLEDs emit light after the injection of charge carriers in the form of electrons from the cathode and in form of holes from the anode into organic layers arranged in between. The charge carrier injection is effected on the basis of an applied external voltage, the subsequent formation of excitons in a light emitting zone and the radiative recombination of those excitons. At least one of the electrodes is transparent or semitransparent, in the majority of cases in the form of a transparent oxide, such as indium tin oxide (ITO), or a thin metal layer.

Among the matrix compounds used in OLED light emitting layers (LELs) or electron transporting layers (ETLs), important position have the compounds that comprise at least one polar group selected from phosphine oxide and diazole. The reason why such polar group often significantly improves the electron injecting and/or electron transporting properties of the semiconducting material is not yet fully understood. It is believed that the high dipole moment of the polar group plays somehow the positive role. Especially recommended for this use are triaryl phosphine oxides comprising at least one condensed aromatic or heteroaromatic group attached directly to the phosphine oxide group, see e.g. JP 4 876 333 B2. Among diazole groups, especially phenylbenzimidazole groups have been widely utilized for the design of new electron transport matrix compounds, for example TPBI described in U.S. Pat. No. 5,645,948, and some compounds comprising benzimidazolyl structural moieties linked with other structural moieties comprising delocalized pi-electrons in two or more aromatic or heteroaromatic rings nowadays are considered to be industrial standard, e.g. compound LG-201 (for example U.S. Pat. No. 6,878,469)

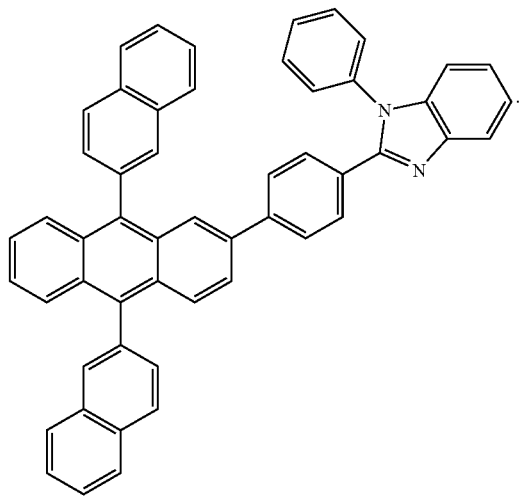

LG-201

Electrical doping of charge transporting semiconducting materials for improving their electrical properties, especially conductivity, is known since 1990s, e.g. from U.S. Pat. No. 5,093,698 A. An especially simple method for n-doping in ETLs prepared by the thermal vacuum deposition, which is currently the standard method most frequently used, e.g. in industrial manufacture of displays, is evaporation of a matrix compound from one evaporation source and of a highly electropositive metal from another evaporation source and their co-deposition on a solid substrate. As useful n-dopants in triaryl phosphine oxide matrix compounds, alkali metals and alkaline earth metals were recommended in JP 4 725 056 B2, with caesium as the dopant successfully used in the given examples. Indeed, caesium as the most electropositive metal offers the broadest freedom in the choice of a matrix material, and it is likely the reason why solely caesium was the n-doping metal of choice in the cited document.

For an industrial use, caesium as a dopant has several serious drawbacks. First, it is very reactive, moisture and highly air sensitive material that renders any handling difficult and incurs significant additional costs for mitigating the high safety and fire hazard unavoidably linked with its use. Second, its quite low normal boiling point (678° C.) indicates that it may be highly volatile under high vacuum conditions. Indeed, at pressures below $10^{-2}$ Pa used in industrial equipment for vacuum thermal evaporation (VTE), caesium metal evaporates significantly already at slightly elevated temperature. Taking into account that the evaporation temperatures for typical matrix compounds used in organic semiconducting materials at pressures below $10^{-2}$ Pa are typically between 150-400° C., avoiding an uncontrolled caesium evaporation, resulting in its undesired deposition contaminating the colder parts of the whole equipment (e.g. the parts that are shielded against heat radiation from the organic matrix evaporation source), is a really challenging task.

Several methods for overcoming these drawbacks and enabling industrial applicability of caesium for n-doping in organic electronic devices have been published. For safe handling, caesium may be supplied in hermetic shells that open just inside the evacuated evaporation source, preferably during heating to the operational temperature. Such technical solution was provided e.g. in WO 2007/065685, however, it does not solve the problem of caesium high volatility.

U.S. Pat. No. 7,507,694 B2 and EP 1 648 042 B1 offer another solution in form of caesium alloys that melt at low temperature and show significantly decreased caesium vapour pressure in comparison with the pure metal. Bismuth alloys of WO2007/109815 that release caesium vapours at pressures of the order $10^{-4}$ Pa and temperatures up to about 450° C. represent another alternative. Yet, all these alloys are still highly air and moisture sensitive. Moreover, this solution has further drawback in the fact that the vapour pressure over the alloy changes with the decreasing caesium concentration during the evaporation. That creates new problem of an appropriate deposition rate control, e.g. by programming the temperature of the evaporation source. So far, quality assurance (QA) concerns regarding robustness of such process on an industrial scale hamper a wider application of this technical solution in mass production processes.

A viable alternative to Cs doping represent highly electropositive transition metal complexes like $W_2(hpp)_4$ that have ionisation potentials comparably low as caesium and volatilities comparable with volatilities of usual organic matrices. Indeed, these complexes disclosed as electrical dopants first in WO2005/086251 are very efficient for most electron transporting matrices except some hydrocarbon matrices. Despite their high air and moisture sensitivity, these metal complexes provide satisfactory n-doping solution for an industrial use, if supplied in the shells according to WO 2007/065685. Their main disadvantage is their high price caused by relative chemical complexity of comprised ligands and necessity of a multistep synthesis of the final complex, as well as additional costs incurred by necessity of using the protective shells and/or by the QA and logistic issues linked with shell recycling and refilling.

Another alternative represent strong n-dopants created in situ in the doped matrix from relatively stable precursors by an additional energy supplied e.g. in form of ultraviolet (UV) or visible light of an appropriate wavelength. Appropriate compounds for this solution were provided e.g. in WO2007/107306 A1. Nevertheless, state-of-art industrial evaporation sources require materials with very high thermal stability, allowing their heating to the operational temperature of the evaporation source without any decomposition during the whole operating cycle (e.g., for a week at 300° C.) of the source loaded with the material to be evaporated. Providing organic n-dopants or n-dopant precursors with such long-term thermal stability is a real technical challenge so far. Moreover, the complicated arrangement of the production equipment that must ensure a defined and reproducible additional energy supply for achieving reproducibly the desired doping level (through the in situ activation of the dopant precursor deposited in the matrix) represents an additional technical challenge and a potential source of additional CA issues in mass production.

Yook et al (Advanced Functional Materials 2010, 20, 1797-1802) successfully used caesium azide in laboratory as an air-stable Cs precursor. This compound is known to decompose under heating above 300° C. to caesium metal and elemental nitrogen. This process is, however, hardly applicable in contemporary industrial VTE sources, due to difficult control of such heterogeneous decomposition reaction in a larger scale. Moreover, release of nitrogen gas as a by-product in this reaction brings a high risk that, especially at higher deposition rates desired in the mass production, the expanding gas will expel solid caesium azide particles from the evaporation source, causing thus high defect counts in the deposited layers of doped semiconducting materials.

Another alternative approach for electrical n-doping in electron transporting matrices is doping with metal salts or metal complexes. The most frequently used example of such dopant is lithium 8-hydroxy-quinolinolate (LiQ). It is especially advantageous in matrices comprising a phosphine oxide group, see e.g. WO 2012/173370 A2. The main disadvantage of metal salt dopants is that they improve basically only electron injection to the adjacent layers and do not increase the conductivity of doped layers. Their utilization for decreasing the operational voltage in electronic devices is thus limited on quite thin electron injecting or electron transporting layers and does hardly allow e.g. an optical cavity tuning by using ETLs thicker than approximately 25 nm, what is well possible with redox-doped ETLs having high conductivity. Furthermore, metal salts typically fail as electrical dopants in cases wherein creation of new charge carriers in the doped layer is crucial, e.g. in charge generating layers (CGL, called also p-n junctions) that are necessary for the function of tandem OLEDs.

For the above reasons, and especially for electrical doping in ETLs thicker than approximately 30 nm, the current technical practice prefers lithium as an industrial redox n-dopant (see e.g. U.S. Pat. No. 6,013,384 B2). This metal is relatively cheap and differs from other alkali metals by its somewhat lower reactivity and, especially, by its significantly lower volatility (normal boiling point about 1340° C.), allowing its evaporation in the VTE equipment at temperatures between 350-550° C.

Nevertheless, quite in accordance with its high n-doping power allowing Li to dope majority of usual types of electron transporting matrices, this metal possesses also a high degree of reactivity. It reacts under ambient temperature even with dry nitrogen and for its use in a highly reproducible manufacturing process complying with contemporary industrial QA standards, it must be stored and handled exclusively under high purity noble gases. Moreover, if Li is co-evaporated with matrix compounds that have evaporation temperatures in the range 150-300° C., its significantly higher evaporation temperature in comparison with the matrix evaporation temperature already causes cross-contamination problems in the VTE equipment.

Many documents suggest as alternative n-dopants almost any known metallic element including weakly reductive and highly volatile Zn, Cd, Hg, weakly reductive Al, Ga, In, Tl, Bi, Sn, Pb, Fe, Co, Ni, or even noble metals like Ru, Rh, Ir and/or refractory metals with highest known boiling points like Mo, W, Nb, Zr (see e.g. JP 2009/076508 or WO 2009/106068). Unfortunately, not only in these two documents cited here as examples but throughout the scientific and patent literature overall, there is in fact lack of any evidence that some of these suggestions have ever been experimentally tested.

To be more specific, even WO 2009/106068 that does not merely mention all imaginable dopants but really strives to claim all the named metalloid elements as n-dopants in organic electronic devices due their alleged applicability through a high-temperature decomposition of a gaseous precursor compound in a heated nozzle, does not bring any single numeric value documenting the physical parameters of allegedly prepared doped materials and/or technical performance of allegedly prepared devices.

On the other hand, US2005/0042548 published before the date of priority of WO 2009/106068 teaches in paragraph 0069 (see namely the last two lines of the left column and first three lines of the right column on page 7) that iron pentacarbonyl can be used for n-doping in organic ETMs if the compound is activated by UV radiation which splits off a carbon monoxide ligand. The coordinatively unsaturated iron compound then reacts with the matrix, what results in the observed doping effects. In the light of this previous art showing that the metal carbonyls that were used in the alleged working example of WO 2009/106068 are known n-dopants in organic matrices if activated by supply of additional energy, it seems quite likely that if the applicants of WO2009/106068 really obtained with their jet of iron pentacarbonyl flowing through a ceramic nozzle electrically heated to a white glow (see the last paragraph of the German text on page 12 of the cited PCT application) any doping effect in the target bathocuproin layer, this effect was caused rather by the same coordinatively unsaturated iron carbonyl complex as produced by UV irradiation in US2005/0042548, than with elemental iron as they suggest. This suspicion is further supported by the fourth paragraph on page 13 of the cited PCT application which teaches that the same result can be obtained with a cold nozzle, if the stream of iron pentacarbonyl is irradiated with an infrared laser having the wavelength fitting with the absorption frequency of the CO groups in the iron pentacarbonyl complex. Here, it is even more likely that the laser activation resulted not in naked metal atoms or clusters of metal atoms but in a reactive, coordinately unsaturated iron complex still bearing some carbonyl ligands, analogously to the reactive complex formed by activation with the UV light.

Despite metals with strongly negative standard redox potentials like alkali earth metals or lanthanides are recited as alternative n-dopants besides alkali metals basically in each document dealing with redox n-doping, the record of the proven n-doping with any metal different from alkali metals is very scarce.

Magnesium is in comparison with alkaline metals much less reactive. It reacts even with liquid water at the ordinary temperature very slowly and in air it keeps its metallic luster and does not gain weight for months. It may be thus considered as practically air-stable. Moreover, it has low normal boiling point (about 1100° C.), very promising for its VTE processing in an optimum temperature range for co-evaporation with organic matrices.

On the other hand, the authors of the present application confirmed in a screening done with dozens of state-of-art ETMs that Mg does not possess a sufficient doping strength for common ETMs which are free of strongly polar groups like phosphine oxide group. The only favourable result has been achieved in OLEDs comprising thin electron injection layers consisting of a specific kind of triaryl phosphine oxide matrix (comprising a special tris-pyridyl unit designed for chelating m s), doped with magnesium, as shown in EP 2 452 946 A1. Despite the structural specifity and very favourable (in terms of its LUMO level which is quite deep under the vacuum level in the absolute energy scale) dopability of the exemplary matrix tested with magnesium in EP 2 452 946 A1, the positive results achieved with this n-doped semiconducting material encouraged further research focused on n-doping with substantially air stable metals.

It is an object of the invention to overcome the drawbacks of the prior art and to provide effectively n-doped semiconducting materials, preferably utilizing substantially air stable metals as n-dopants, especially in ETMs having their lowest unoccupied molecular orbital (LUMO) energy levels closer to vacuum level than the ETMs which have electrochemical redox potentials (that are in a simple linear relationship with the LUMO levels and are much easier measurable than LUMO levels themselves) with more negative values than about −2.25 V against ferrocenium/ferrocene reference.

It is a further object of the invention to provide alternative metallic elements which are substantially air stable and can be successfully embedded (preferably by standard VTE processes and using contemporary evaporation sources) in electrically doped semiconducting materials for use in electronic devices.

A third object of the invention is to provide a process for manufacturing the semiconducting material utilizing substantially air stable metals as n-dopants.

A fourth object of the invention is to provide devices with better characteristics, especially with low voltage and, more specifically, OLEDs with low voltage and high efficiency.

A fifth object of the invention is to provide new matrix compounds applicable in semiconducting materials according to the invention.

II. SUMMARY OF THE INVENTION

The object is achieved by a semiconducting material comprising
(i) in substantially elemental form, an electropositive element selected from alkali metals, alkaline earth metals, rare earth metals, and transition metals of the fourth period of the Periodic table having proton numbers 22, 23, 24, 25, 26, 27, 28, 29, and
(ii) at least one first compound which is a compound comprising at least one polar group selected from phosphine oxide group or diazole group, wherein
the first compound is a substantially covalent compound which is free of a conjugated system of delocalized electrons or comprises a conjugated system of delocalized electrons having less than 10 conjugated delocalized electrons, and the reduction potential of the first compound, if measured by cyclic voltammetry under the same conditions, has the value which is more negative than the value obtained for tris(2-benzo[d]thiazol-2-yl)phenoxyaluminum, preferably more negative than for 9,9',10,10'-tetraphenyl-2,2'-bianthracene or 2,9-di([1,1'-biphenyl]-4-yl)-4,7-diphenyl-1,10-phenanthroline, more preferably more negative than for 2,4,7,9-tetraphenyl-1,10-phenanthroline, even more preferably more negative than for 9,10-di(naphthalen-2-yl)-2-phenylanthracene, even more preferably more negative than for 2,9-bis(2-methoxyphenyl)-4,7-diphenyl-1,10-phenanthroline, even more preferably more negative than for 9,9'-spirobi[fluorene]-2,7-diylbis(diphenylphosphine oxide), even more preferably more negative than for 4,7-diphenyl-1,10-phenanthroline, even more preferably more negative than for 1,3,5-tris(1-phenyl-1H-benzimidazol-2-yl)benzene, most preferably more negative than for pyrene and still preferably more negative than the value obtained for [1,1'-binaphthalen]-2,2'-diylbis(diphenylphosphine oxide).

It is to be understood that "substantially covalent" means compounds comprising elements bound together mostly by covalent bonds. Examples of substantially covalent molecular structures may be organic compounds, organometallic compounds, metal complexes, comprising polyatomic ligands, metal salts of organic acids. In this sense, the term "substantially, organic layer" is to be understood as a layer comprising a substantially covalent electron transport matrix compound.

It is further understood that the term "substantially covalent compound" encompasses materials which can be processed by usual techniques and equipment for manufacturing organic electronic devices, like vacuum thermal evaporation or solution processing. It is clear that purely inorganic crystalline or glassy semiconducting materials like silicon or germanium which cannot be, due to their extreme high vaporization temperatures and insolubility in solvents, prepared in equipment for organic electronic devices, are not encompassed by the term "substantially covalent compound.

It is preferred that the first compound has the structure according to formula (I)

A1Q-A2     (I), wherein $A^1$ and $A^2$ are polar groups independently selected from a phosphine oxide group and a diazole group, and Q is a direct bond or a spacer consisting of up to 100 covalently bound atoms preferably selected from C, H, B, Si, N, P, O, S, F, Cl, Br and I, which does not comprise a conjugated system of delocalized electrons.

Examples of conjugated systems of delocalized electrons are systems of alternating pi- and sigma bonds. Optionally, one or more two-atom structural units having the pi-bond between its atoms can be replaced by an atom bearing at least one lone electron pair, typically by a divalent atom selected from O, S, Se, Te or by a trivalent atom selected from N, P, As, Sb, Bi. Preferably, the conjugated system of delocalized electrons comprises at least one aromatic ring adhering to the Hückel rule. Therefore, the phosphine oxide group in the first compound is preferably substituted with groups that either do not comprise aromatic or heteroatomatic rings at all, or do comprise only simple isolated aromatic or heteroaromatic rings having typically from three to seven ring atoms and separated from each other by structural moieties like alkylene groups that do not comprise delocalized electrons and thus hamper conjugation of delocalized electrons between linked aromatic or heteroaromatic rings.

More preferably, Q is an oligomethylene spacer having formula (Ib)

—(CH2)$_x$—     (Ib), wherein x is an integer equal 1, 2, 3 or 4. Also preferably, the phosphine oxide polar group is selected from phosphine oxide substituted with two monovalent hydrocarbyl groups or one divalent hydrocarbylene group forming with the phosphorus atom a ring, and the overall count of carbon atoms in the two hydrocarbyl groups or in the hydrocarbylene group is preferably 2-60. In another preferred embodiment, there are two substantially covalent compounds comprised in the semiconducting material, the first compound comprising the polar group selected from the phosphine oxide group and the diazole group, wherein the first compound is free of a conjugated system of delocalized electrons, or does comprise a conjugated system of less than 10 delocalized electrons; and the second compound that does comprise a conjugated system of at least 10 delocalized electrons. More preferably, the second compound is free of a polar group selected from the phosphine oxide group and/or the diazole group.

Preferably, the conjugated system of delocalized electrons in the second compound comprises at least one aromatic ring adhering to the Mickel rule. More preferably, the conjugated system of delocalized electrons comprises a condensed aromatic skeleton comprising at least 10 delocalized electrons, e.g. a naphthalene, anthracene, phenanthrene, pyrene, quinoline, indole or carbazole skeleton. Also preferably, the conjugated system of delocalized electrons may consist of at least two directly attached aromatic rings, the simplest examples of such systems being biphenyl, bithienyl, phenylthiophene, phenylpyridine and like. On the other hand, it is known that a pentavalent phosphorus atom, for example the phosphorus atom in the phosphine oxide group, does not participate in conjugation in systems of delocalized electrons attached to the pentavalent P atom, and in this sense resembles $sp^3$ hybridized carbon, for example the carbon atom in a methylene group. Most preferably, the conjugated system of at least 10 delocalized electrons comprised in the second compound is comprised in a $C_{14}$-$C_{50}$-arene or a $C_8$-$C_{50}$ heteroarene structural moiety, wherein the overall count of carbon atoms comprises also possible substituents. It is in the spirit of the present invention that the count, topology and spatial arrangement of the substituents on the structural moiety comprising the conjugated system of delocalized electrons is not decisive for the function of the invention. Preferred heteroatoms in the heteroarene structural moiety are B, O, N and S. In the second compound, both the core atoms bearing the comprised system of delocalized electrons as well as the polyvalent atoms like C, Si, B, which preferably form the peripheral substituents attached to the core atoms, may be substituted with terminal atoms of elements which are typically monovalent in organic compounds and which are more preferably selected from H, F, Cl, Br and I. Also preferably, the reduction potential of the second compound, when measured by cyclic voltammetry under the same conditions, has the value which is more negative than for tris(2-benzo[d]thiazol-2-yl)phenoxyaluminum, preferably more negative than for 9,9',10, 10'-tetraphenyl-2,2'-bianthracene or 2,9-di([1,1'-biphenyl]-4-yl)-4,7-diphenyl-1,10-phenanthroline, more preferably more negative than for 2,4,7,9-tetraphenyl-1,10-phenanthroline, more preferably more negative than for 9,10-di(naphthalen-2-yl)-2-phenylanthracene, more preferably more negative than for 2,9-bis(2-methoxyphenyl)-4,7-diphenyl-1,10-phenanthroline, more preferably lower than for 9,9'-spirobi[fluorene]-2,7-diylbis(diphenylphosphine oxide), even more preferably more negative than for 4,7-diphenyl-1,10-phenanthroline, even more preferably more negative than for 1,3,5-tris(1-phenyl-1H-benzimidazol-2-yl)benzene, most preferably more negative than for pyrene and still preferably more negative than the value obtained for [1,1'-binaphthalen]-2,2'-diylbis(diphenylphosphine oxide).

In one of preferred embodiments, the electrically doped semiconducting material further comprises a metal salt additive consisting of at least one metal cation and at least one anion. Preferably, the metal cation is $Li^+$ or $Mg^{2+}$. Also preferably, the metal salt additive is selected from metal complexes comprising a 5-, 6- or 7-membered ring that contains a nitrogen atom and an oxygen atom attached to the metal cation and from complexes having the structure according to formula (II)

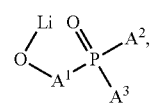

Formula (II)

wherein $A^1$ is a $C_6$-$C_{30}$ arylene or $C_2$-$C_{30}$ heteroarylene comprising at least one atom selected from O, S and N in an aromatic ring each of $A^2$ and $A^3$ is independently selected from a $C_6$-$C_{30}$ aryl and $C_2$-$C_{30}$ heteroaryl comprising at least one atom selected from O, S and N in an aromatic ring. Equally preferably, the anion is selected from the group consisting of phenolate substituted with a phosphine oxide group, 8-hydroxyquinolinolate and pyrazolylborate. The metal salt additive preferably works as a second electrical n-dopant, more preferably, it works synergistically with the metallic element present in the elemental form and works as the first electrical n-dopant.

Preferably, the electropositive element in a substantially elemental form is selected from Li, Na, K, Mg, Ca, Sr, Ba, Sm, Eu, Tm, Yb and Mn, more preferably from Li, Mg, Ca, Sr, Ba, Sm, Eu, Tm, Yb, most preferably from Li, Mg, Yb.

Also preferably, the the molar ratio of the electropositive element to the first compound is lower than 0.5, preferably lower 0.4, more preferably lower than 0.33, even more preferably lower than 0.25, even more preferably lower 0.20, even more preferably lower than 0.17, most preferably lower than 0.15, still preferably lower than 0.13, still but less preferably lower than 0.10.

It is further preferred that the molar ratio of the electropositive element to the first compound is higher than 0.01, preferably higher than 0.02, more preferably higher than 0.03, even more preferably higher than 0.05, most preferably higher 0.08.

The second object of the invention is achieved by using a metal selected from rare e metals with exception of Sm, Eu and Yb or transition metals of the fourth period of the Periodic Table with exception of Mn and Zn as an electrical n-dopant in any of electrically doped semiconducting materials defined above.

The third object of the invention is achieved by process for manufacturing the semiconducting material, comprising a step wherein
  (i) an electropositive element selected from alkali metals, alkaline earth metals, rare earth metals, and transition metals of the fourth period of the Periodic table having proton numbers 22, 23, 24, 25, 26, 27, 28, 29, and
  (ii) at least one first compound which is a compound comprising at least one polar group selected from phosphine oxide group or diazole group, wherein
  the first compound is a substantially covalent compound which is free of a conjugated system of delocalized electrons or comprises a conjugated system of delocalized electrons having less than 10 conjugated delocalized electrons, and the reduction potential of the organic compound, if measured by cyclic voltammetry under the same conditions, has the value which is more negative than the value obtained for tris(2-benzo[d]thiazol-2-yl)phenoxyaluminum, preferably more negative than for 9,9', 10,10'-tetraphenyl-2,2'-bianthracene or 2,9-di([1,1'-biphenyl]-4-yl)-4,7-diphenyl-1,10-phenanthroline, more preferably more negative than for 2,4,7,9-tetraphenyl-1,10-phenanthroline, even more preferably more negative than for 9,10-di(naphthalen-2-yl)-2-phenylanthracene, even more preferably more negative than for 2,9-bis(2-methoxyphenyl)-4,7-diphenyl-1,10-phenanthroline, even more preferably more negative than for 9,9'-spirobi[fluorene]-2,7-diylbis(diphenylphosphine oxide), even more preferably more negative than for 4,7-diphenyl-1,10-phenanthroline, even more preferably more negative than for 1,3,5-tris(1-phenyl-1H-benzimidazol-2-yl)benzene, most preferably more negative than for pyrene and still preferably more negative than the value obtained for [1,1'-binaphthalen]-2,2'-diylbis(diphenylphosphine oxide),
are coevaporated and codeposited under reduced pressure, the electropositive element being deposited in its elemental or substantially elemental form. Preferably, the electropositive element is evaporated from its elemental or substantially elemental form, more preferably from a substantially air stable elemental or substantially elemental form. Also preferably, the pressure is lower than $10^{-2}$ Pa, more preferably lower than $10^{-3}$ Pa, most preferably lower than $10^{-4}$ Pa.

Preferably, the electropositive element has normal boiling point lower than 3000° C., more preferably lower than 2200° C., even more preferably lower than 1800° C., most preferably lower than 1500° C. Under normal boiling point, it is to be understood the boiling point at normal atmospheric pressure (101.325 kPa).

It is to be understood that the term "substantially air stable" refers to metals and their substantially elemental forms (e.g. alloys with other metals) which react under ambient conditions with atmospheric gases and moisture slowly enough to avoid quality assurance issues if the form is handled under ambient conditions in an industrial process. More specifically, a form of a metal shall be assigned as substantially air stable for the purposes of this application, if a sample of this form having the weight at least 1 g and a surface exposed to air at least 1 cm$^2$ may be kept under standard temperature 25° C., pressure 101 325 Pa and relative humidity 80% for at least an hour, preferably for at least 4 hours, more preferably for at least 24 hours, and most preferably for at least 240 hours, without showing a statistically significant weight gain, provided that the accuracy of weighing is at least 0.1 mg.

Preferably, the electropositive element in a substantially elemental form is selected from Li, Na, K, Mg, Ca, Sr, Ba, Sm, Eu, Tm, Yb and Mn, more preferably from Li, Mg, Ca, Sr, Ba, Sm, Eu, Tm, Yb, most preferably from Li, Mg, Yb. Also preferably, the electropositive element is evaporated from an elemental or substantially elemental form which is substantially air stable. Most preferably, the electropositive element is evaporated from a linear evaporation source. The first object of the invention is achieved also by electrically doped semiconducting material preparable by any of the above described processes according to invention.

The fourth object of the invention is achieved by electronic device comprising a cathode, an anode and, between the cathode and the anode, the semiconducting material comprising
  (i) in substantially elemental form, an electropositive element selected from alkali metals, alkaline earth metals, rare earth metals, and transition metals of the fourth period of the Periodic table having proton numbers 22, 23, 24, 25, 26, 27, 28, 29, and
  (ii) at least one first compound which is a compound comprising at least one polar group selected from phosphine oxide group or diazole group, wherein
  the first compound is a substantially covalent compound which is free of a conjugated system of delocalized electrons or comprises a conjugated system of delocalized electrons having less than 10 conjugated delocalized electrons, and the reduction potential of the first compound, if measured by cyclic voltammetry under the same conditions, has the value which is more negative than the value obtained for tris(2-benzo[d]thiazol-2-yl)phenoxyaluminum, preferably more negative than for 9,9',10,10'-tetraphenyl-2,2'-bianthracene or 2,9-di([1,1'-biphenyl]-4-yl)-4,7-diphenyl-1,10-phenanthroline, more preferably more negative than for 2,4,7,9-tetraphenyl-1,10-phenanthroline, even more preferably more negative than for 9,10-di(naphthalen-2-yl)-2-phenylanthracene, even more preferably more negative than for 2,9-bis(2-methoxyphenyl)-4,7-diphenyl-1,10-phenanthroline, even more preferably more negative than for 9,9'-spirobi[fluorene]-2,7-diylbis(diphenylphosphine oxide), even more preferably more negative than for 4,7-diphenyl-1,10-phenanthroline, even more preferably more negative than for 1,3,5-tris(1-phenyl-1H-benzimidazol-2-yl)benzene, most preferably more negative than for pyrene and still preferably more negative than the value obtained for [1,1'-binaphthalen]-2,2'-diylbis(diphenylphosphine oxide) or preparable by a process recited above.

Preferred embodiments of the electronic device according to the invention comprise preferred embodiments of the inventive semiconducting material as recited above. More preferably, the preferred embodiments of the electronic device according to invention comprise the inventive semiconducting material prepared by any embodiment of the inventive process characterized above. Preferably, the device further comprises at least one light emitting layer between the anode and the cathode.

Preferably, the semiconducting material forms an electron transporting, electron injecting, or charge injecting layer. More preferably, the electron transporting or electron injecting layer is adjacent to a layer consisting of compounds that have their reduction potentials, if measured by cyclic voltammetry under the same conditions, more negative than the electron transport matrix compounds of the adjacent electron transporting or electron injecting layer. In one of preferred embodiments, the layer adjacent to the layer made of inventive semiconducting material is the emitting layer.

It is further preferred that the light emitting layer emits blue or white light. In one of preferred embodiments, the light emitting layer comprises at least one polymer. More preferably, the polymer is a blue light emitting polymer.

Also preferably, the electron transporting or electron injecting layer is thicker than 5 nm, preferably thicker than 10 nm, more preferably thicker than 15 nm, even more preferably thicker than 20 nm, most preferably thicker than 25 nm, still preferably thicker than 50 nm, and still preferably thicker than 100 nm.

In one of preferred embodiments, the electron transporting or electron injecting layer is adjacent to a cathode consisting of a semiconducting metal oxide. Preferably, the semiconducting metal oxide is indium tin oxide. Also preferably, the cathode is prepared by sputtering.

Still another embodiment of the invention is a tandem OLED stack comprising a metal-doped pn-junction comprising the semiconducting material comprising (i) in substantially elemental form, an electropositive element selected from alkali metals, alkaline earth metals, rare earth metals, and transition metals of the fourth period of the Periodic table having proton numbers 22, 23, 24, 25, 26, 27, 28, 29, and (ii) at least one first compound which is a compound comprising at least one polar group selected from phosphine oxide group or diazole group, wherein the first compound is a substantially covalent compound which is free of a conjugated system of delocalized electrons or comprises a conjugated system of delocalized electrons having less than 10 conjugated delocalized electrons, and the reduction potential of the first compound, if measured by cyclic voltammetry under the same conditions, has the value which is more negative than the value obtained for tris(2-benzo[d]thiazol-2-yl)phenoxyaluminum, preferably more negative than for 9,9',10,10'-tetraphenyl-2,2'-bianthracene or 2,9-di([1,1'-biphenyl]-4-yl)-4,7-diphenyl-1,10-phenanthroline, more preferably more negative than for 2,4,7,9-tetraphenyl-1,10-phenanthroline, even more preferably more negative than for 9,10-di(naphthalen-2-yl)-2-phenylanthracene, even preferably more negative than for 2,9-bis(2-methoxyphenyl)-4,7-diphenyl-1,10-phenanthroline, even more preferably more negative than for 9,9'-spirobi[fluorene]-2,7-diylbis(diphenylphosphine oxide), even more preferably more negative than for 4,7-diphenyl-1,10-phenanthroline, even more preferably more negative than for 1,3,5-tris(1-phenyl-1H-benzimidazol-2-yl)benzene, most preferably more negative than for pyrene and still preferably more negative than the value obtained for [1,1'-binaphthalen]-2,2'-diylbis(diphenylphosphine oxide) or preparable by a process recited above.

III. BRIEF DESCRIPTION OF DRAWINGS

IV. DETAILED DESCRIPTION OF THE INVENTION

Device Architecture

Figure 1:
FIG. 1 shows a schematic illustration of a device in which the present invention can be incorporated.

FIG. 1 shows a stack of anode (10), organic semiconducting layer (11) comprising the light emitting layer, electron transporting layer (ETL) (12), and cathode (13). Other layers can be inserted between those depicted, as explained herein.

Figure 2:
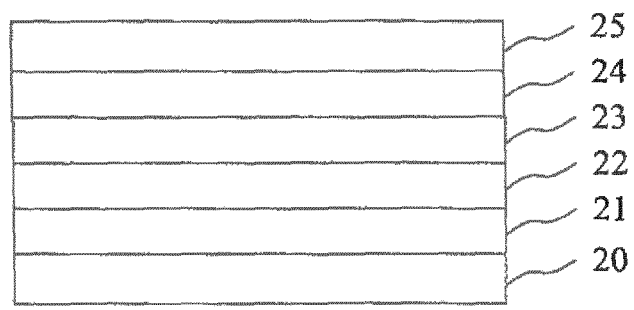
FIG. 2 shows a schematic illustration of a device in which the present invention can be incorporated.
Figure 3:
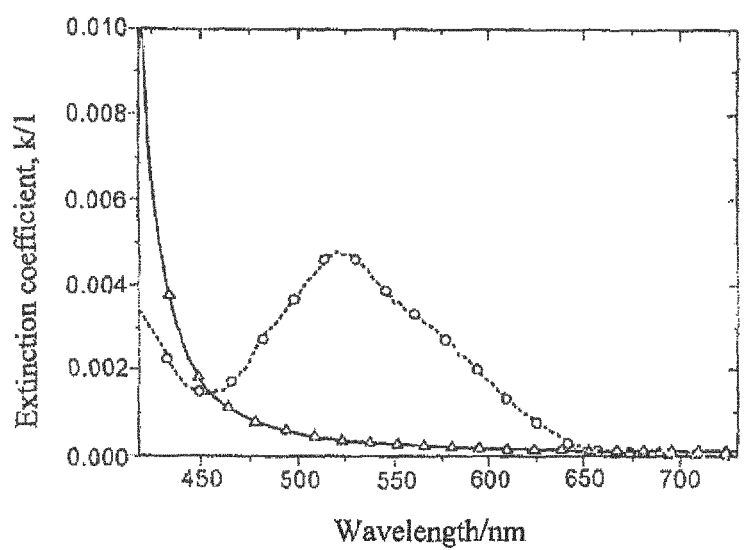
FIG. 3 shows absorbance curves of two n-doped semiconducting materials; circles stand for comparative matrix compound C10 doped with 10 wt % of compound F1 that forms strongly reducing radicals, triangles stand for compound E10 doped with 5 wt % Mg.

FIG. 2 shows a stack of an anode (20), a hole injecting and transporting layer (21), a hole transporting layer (22) which can also aggregate the function of electron blocking, a light emitting layer (23), an ETL (24), and a cathode (25). Other layers can be inserted between those depicted, as explained herein.

The wording "device" comprises the organic light emitting diode.

Material Properties—Energy Levels

A method to determine the ionization potentials (IP) is the ultraviolet photo spectroscopy (UPS). It is usual to measure the ionization potential for solid state materials; however, it is also possible to measure the IP in the gas phase. Both values are differentiated by their solid state effects, which are, for example the polarization energy of the holes that are created during the photo ionization process. A typical value for the polarization energy is approximately 1 eV, but larger discrepancies of the values can also occur. The IP is related to onset of the photoemission spectra in the region of the large kinetic energy of the photoelectrons, i.e. the energy of the most weakly bounded electrons. A related method to UPS, the inverted photo electron spectroscopy (IPES) can be used to determine the electron affinity (EA). However, this method is less common. Electrochemical measurements in solution are an alternative to the determination of solid state oxidation ($E_{ox}$) and reduction ($E_{red}$) potential. An adequate method is, for example, cyclic voltammetry. To avoid confusion, the claimed energy levels are defined in terms of comparison with reference compounds having well defined redox potentials in cyclic voltammetry, when measured by a standardized procedure. A simple rule is very often used for the conversion of redox potentials into electron affinities and ionization potential: IP (in eV)=4.8 eV)+e*$E_{ox}$ (wherein $E_{ox}$ is given in volts vs. ferrocenium/ferrocene ($Fc^+$/Fc)) and EA (in eV)=4.8 eV+e*$E_{red}$ ($E_{red}$ is given in volts vs. $Fc^+$/Fc) respectively (see B. W. D'Andrade, Org. Electron. 6, 11-20 (2005)), e* is the elemental charge. Conversion factors for recalculation of the electrochemical potentials in the case other reference electrodes or other reference redox pairs are known (see A. J. Bard, L. R. Faulkner, "Electrochemical Methods: Fundamentals and Applications", Wiley, 2. Ausgabe 2000). The information about the influence of the solution used can be found in N. G. Connelly et al., Chem. Rev. 96, 877 (1996). It is usual, even if not exactly correct, to use the terms "energy of the HOMO" $E_{(HOMO)}$ and "energy of the LUMO" $E_{(LUMO)}$, respectively, as synonyms for the ionization energy and electron affinity (Koopmans Theorem). It has to be taken into consideration that the ionization potentials and the electron affinities are usually reported in such a way that a larger value represents a stronger binding of a released or of an absorbed electron, respectively. The energy scale of the frontier molecular orbitals (HOMO, LUMO) is opposed to this. Therefore, in a rough approximation, the following equations are valid: $IP=-E_{(HOMO)}$ and $EA=E_{(LUMO)}$ (the zero energy is assigned to the vacuum).

For the chosen reference compounds, the inventors obtained following values of the reduction potential by standardized cyclic voltammetry in tetrahydrofuran (THF) solution vs. $Fe^+/Fc$:

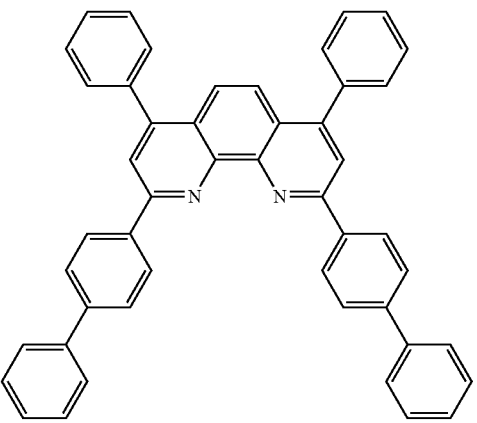

2,9-di([1,1'-biphenyl]-4-yl)-4,7-diphenyl-1,10-phenanthroline, CAS 338734-83-1, −2.29 V, B2;

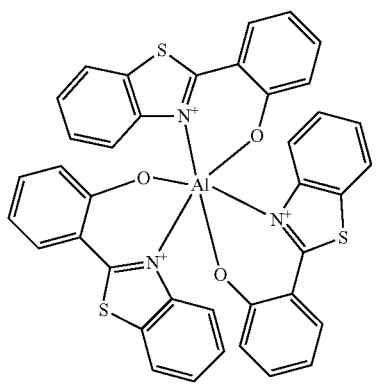

tris(2-benzo[d]thiazol-2-yl)phenoxyaluminum, CAS 1269508-14-6, −2.21 V, B0;

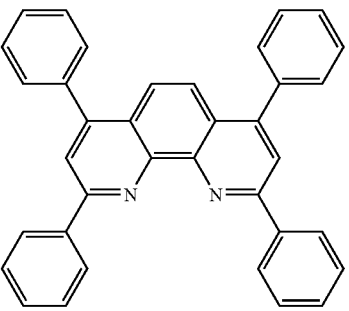

2,4,7,9-tetraphenyl-1,10-phenanthroline, CAS 51786-73-3, −2.33 V, B3;

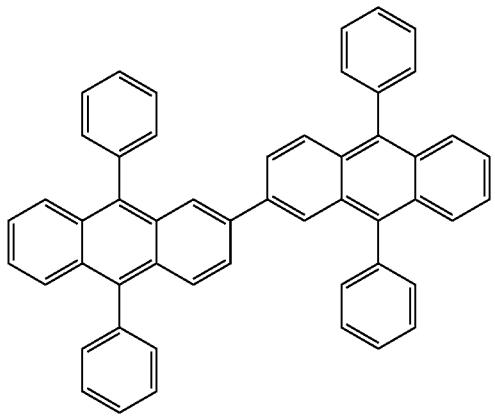 [SMILES: c1ccc(-c2c3ccccc3c(-c3ccccc3)c3cc(-c4ccc5c(-c6ccccc6)c6ccccc6c(-c6ccccc6)c5c4)ccc23)cc1]

9,9',10,10'-tetraphenyl-2,2'-bianthracene (PBA), CAS 172285-72-2, −2.28 V, B1;

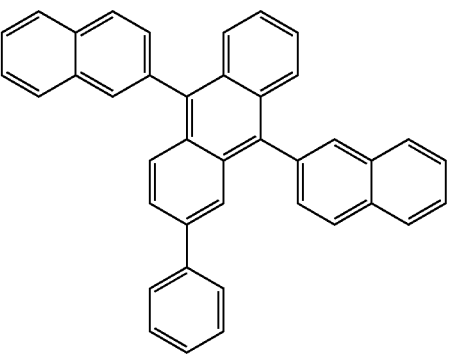 [SMILES: c1ccc(-c2ccc3c(-c4ccc5ccccc5c4)c4ccccc4c(-c4ccc5ccccc5c4)c3c2)cc1]

9,10-di(naphthalen-2-yl)-2-phenylanthracene (PADN), CAS 865435-20-7, −2.37 V, B4;

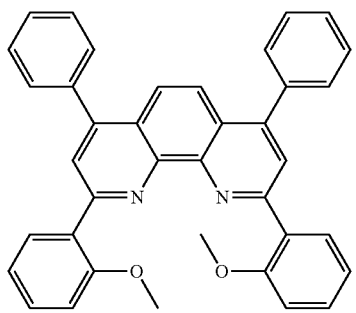 [SMILES: COc1ccccc1-c1cc(-c2ccccc2)c2ccc3c(-c4ccccc4)cc(-c4ccccc4OC)nc3c2n1]

2,9-bis(2-methoxyphenyl)-4,7-diphenyl-1,10-phenanthroline, CAS 553677-79-5, −2.40 V, B5;

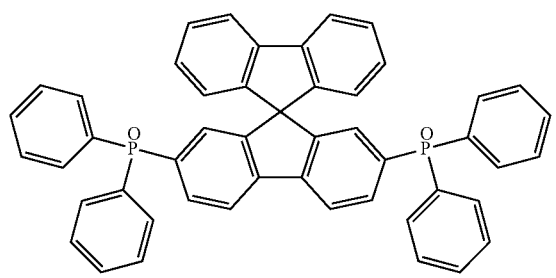

9,9'-spirobi[fluorene]-2,7-diylbis(diphenylphosphine oxide) (SPPO13), CAS 1234510-13-4, −2.41 V, B6;

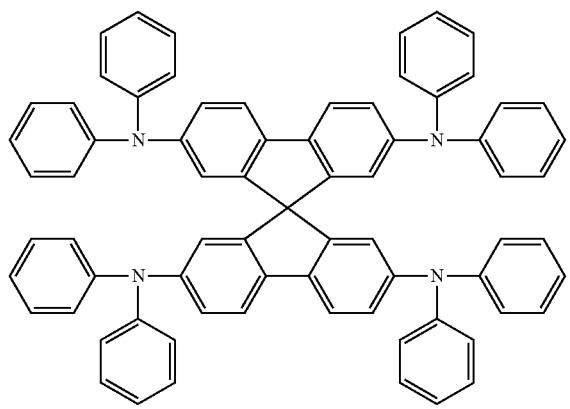 [SMILES: c1ccc(N(c2ccccc2)c2ccc3c(c2)C2(c4cc(N(c5ccccc5)c5ccccc5)ccc4-3)c3cc(N(c4ccccc4)c4ccccc4)ccc3-c3ccc(N(c4ccccc4)c4ccccc4)cc32)cc1]

N2,N2,N2',N2',N7,N7,N7',N7'-octaphenyl-9,9'-spirobi[fluorene]-2,2',7,7'-tetraamine (Spiro TAD), CAS 189363-47-1, −3.10V, B7;

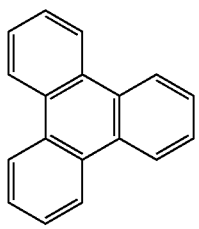 [SMILES: c1ccc2c(c1)c1ccccc1c1ccccc21]

triphenylene, CAS 217-59-4, −3.04 V, B8;

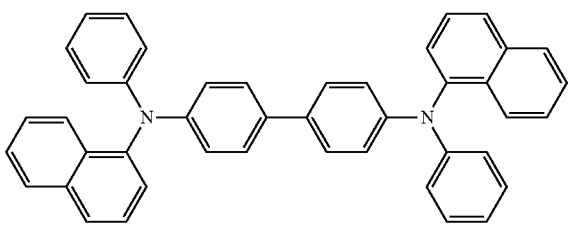 [SMILES: c1ccc(N(c2ccc(-c3ccc(N(c4ccccc4)c4cccc5ccccc45)cc3)cc2)c2cccc3ccccc23)cc1]

N4,N4'-di(naphthalen-1-yl)-N4,N4'-diphenyl-[1,1-biphenyl]-4,4'-diamine (alpha-NPD), CAS 123847-85-8, −2.96 V, B9;

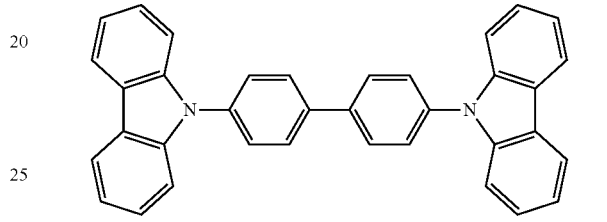

4,4'-di(9H-carbazol-9-yl)-1,1'-biphenyl (CBP), CAS 58328-31-7, −2.91 V, B10;

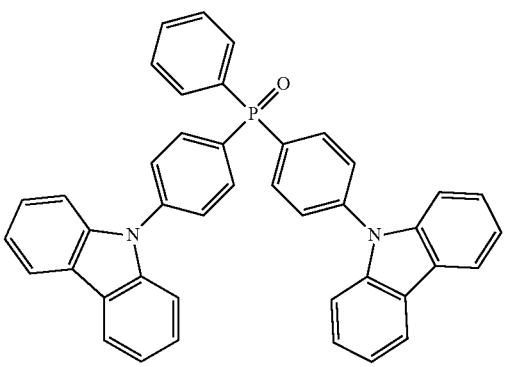 [SMILES: O=P(c1ccccc1)(c1ccc(-n2c3ccccc3c3ccccc32)cc1)c1ccc(-n2c3ccccc3c3ccccc32)cc1]

bis(4-(9H-carbazol-9-yl)phenyl)(phenyl)phosphine oxide (BCPO), CAS 1233407-28-7, −2.86, B11;

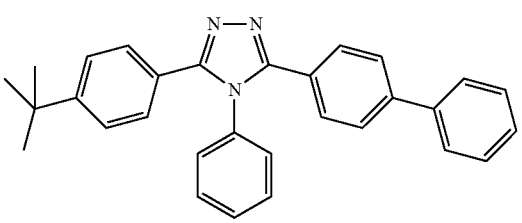 [SMILES: CC(C)(C)c1ccc(-c2nnc(-c3ccc(-c4ccccc4)cc3)n2-c2ccccc2)cc1]

3-([1,1'-biphenyl]-4-yl)-5-(4-(tert-butyl)phenyl)-4-phenyl-4H-1,2,4-triazole (TAZ), −2.76 V, B12;

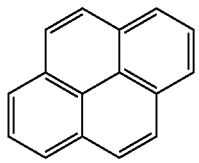 [SMILES: c1cc2ccc3cccc4ccc(c1)c2c34]

pyrene, CAS 129-00-0, −2.64 V, B13.

Examples of matrix compounds for state-of-art electrically doped semiconducting materials based on matrix compounds comprising phosphine oxide group and a conjugated system of at least 10 delocalized electrons are

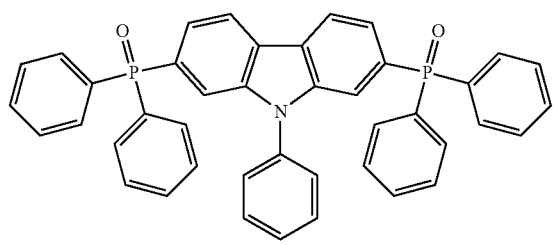 [SMILES: O=P(c1ccccc1)(c1ccccc1)c1ccc2c3ccc(P(=O)(c4ccccc4)c4ccccc4)cc3n(-c3ccccc3)c2c1]

(9-phenyl-9H-carbazole-2,7-diyl)bis(diphenylphosphine oxide) (PPO27), CAS 1299463-56-1, −2.51 V, E1;

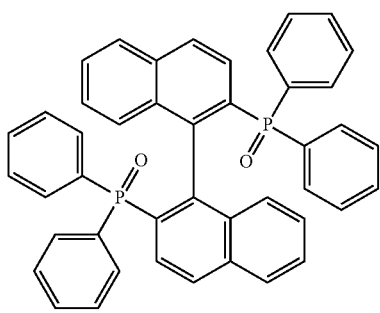 [SMILES: O=P(c1ccccc1)(c1ccccc1)c1ccc2ccccc2c1-c1c(P(=O)(c2ccccc2)c2ccccc2)ccc2ccccc12]

[1,1'-binaphthalen]-2,2'-diylbis(diphenylphosphine oxide) (BINAPO), CAS 86632-33-9, −2.69 V, E2;

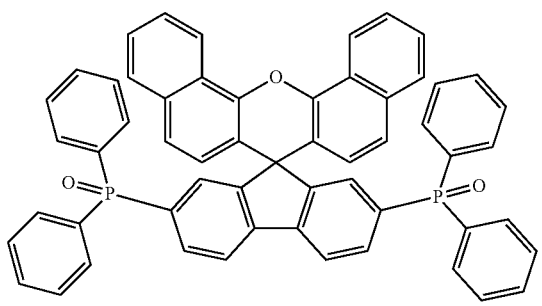 [SMILES: O=P(c1ccccc1)(c1ccccc1)c1ccc2c(c1)C1(c3cc(P(=O)(c4ccccc4)c4ccccc4)ccc3-2)c2ccc3ccccc3c2Oc2c1ccc1ccccc21]

spiro[dibenzo[c,h]xanthene-7,9'-fluorene]-2',7-diylbis(diphenylphosphine oxide), −2.36 V, E3;

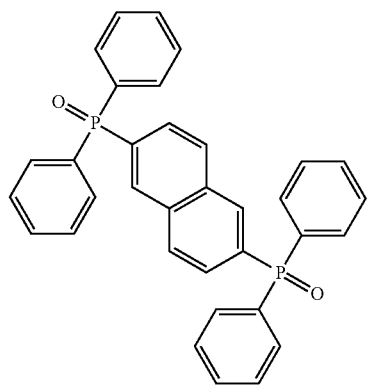 [SMILES: O=P(c1ccccc1)(c1ccccc1)c1ccc2cc(P(=O)(c3ccccc3)c3ccccc3)ccc2c1]

naphtalene-2,6-diylbis(diphenylphosphine oxide), −2.41 V, E4;

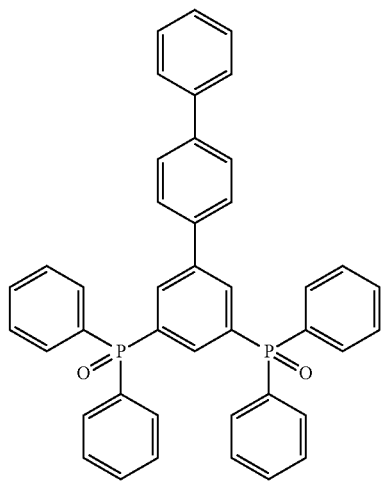 [SMILES: O=P(c1ccccc1)(c1ccccc1)c1cc(-c2ccc(-c3ccccc3)cc2)cc(P(=O)(c2ccccc2)c2ccccc2)c1]

[1,1': 4',1"-terphenyl]-3,5-diylbis(diphenylphosphine oxide), −2.58 V. E5;

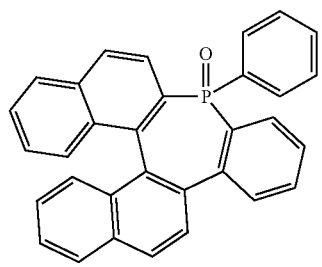 [SMILES: O=P1(c2ccccc2)c2ccccc2-c2ccc3ccccc3c2-c2c1ccc1ccccc21]

3-phenyl-3H-benzo[b]dinaphto[2,1-d:1',2'-f]phosphepine-3-oxide, CAS 597578-38-6, −2.62 V, E6;

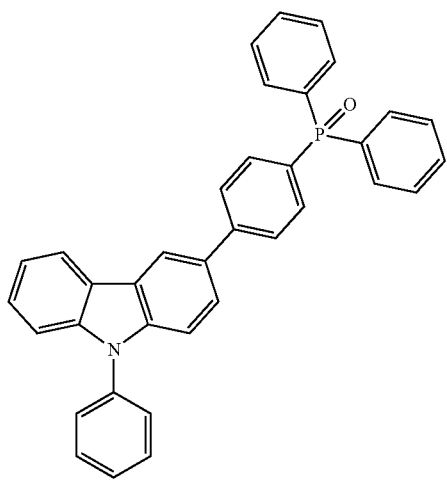 [SMILES: O=P(c1ccccc1)(c1ccccc1)c1ccc(-c2ccc3c(c2)c2ccccc2n3-c2ccccc2)cc1]

diphenyl(4-(9-phenyl-9H-carbazol-3-yl)phenylphosphine oxide, −2.81 V, E7;

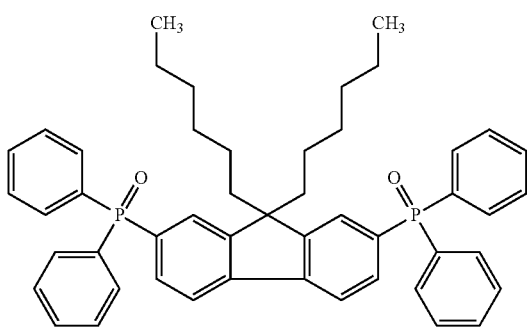 [SMILES: CCCCCCC1(CCCCCC)c2cc(P(=O)(c3ccccc3)c3ccccc3)ccc2-c2ccc(P(=O)(c3ccccc3)c3ccccc3)cc21]

(9,9-dihexyl-9H-fluorene-2,7-diyl)bis(diphenylphosphine oxide), −2.52 V, E8;

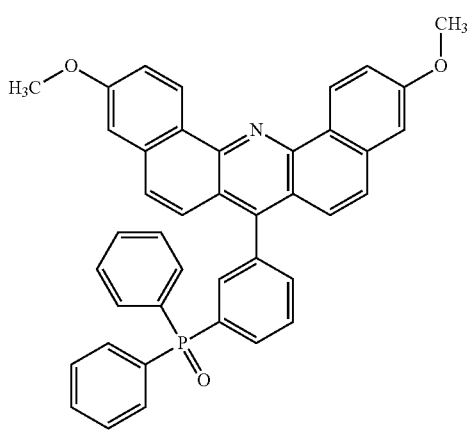

(3-(3,11-dimethoxydibenzo[c,h]acridin-7-yl)phenyl)diphenylphosphine oxide (described in WO2013/079217 A1), −2.29 V, E9;

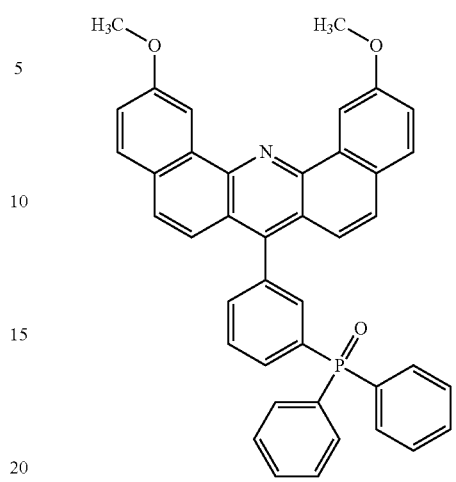

(3-(2,12-dimethoxydibenzo[c,h]acridin-7-yl)phenyl)diphenylphosphine oxide (described in WO2013/079217 A1), −2.24 V, E10;

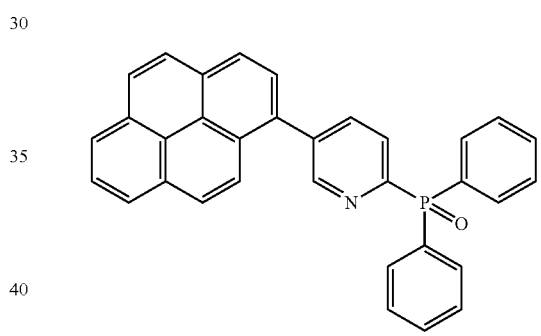

diphenyl(5-(pyren-1-yl)pyridine-2-yl)phosphine oxide, described in WO2014/167020, −2.34 V, E11;

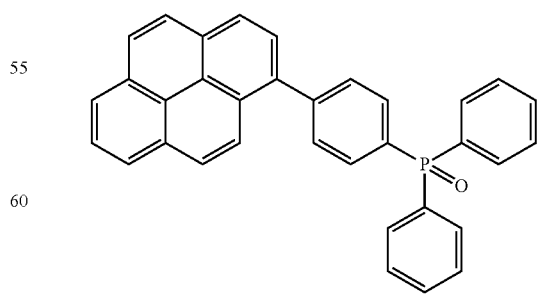

diphenyl(4-(pyren-1-yl)phenyl)phosphine oxide, described in PCT/EP2014/071659, −2.43 V, E12;

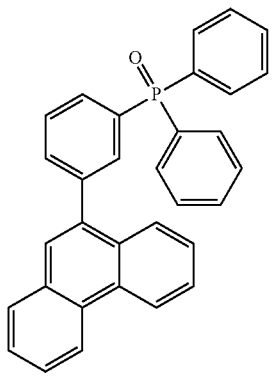 [SMILES: O=P(c1ccccc1)(c1ccccc1)c1cccc(-c2cc3ccccc3c3ccccc23)c1]

(3-(anthracen-9-yl)phenyl)diphenylphosphine oxide, −2.78 V, E13;

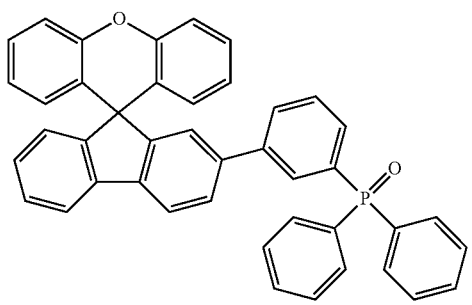 [SMILES: O=P(c1ccccc1)(c1ccccc1)c1cccc(-c2ccc3c(c2)C2(c4ccccc4Oc4ccccc42)c2ccccc2-3)c1]

diphenyl-(3-(spiro[fluorene-9,9'-xanthen]-2-yl)phenyl) phosphine oxide, −2.71 V E14;

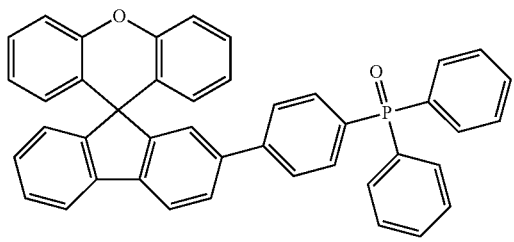 [SMILES: O=P(c1ccccc1)(c1ccccc1)c1ccc(-c2ccc3c(c2)C2(c4ccccc4Oc4ccccc42)c2ccccc2-3)cc1]

diphenyl-(4-(spiro[fluorene-9,9'-xanthen]-2-yl)phenyl) phosphine oxide, −2.65 V, E15.

As comparative compounds were used

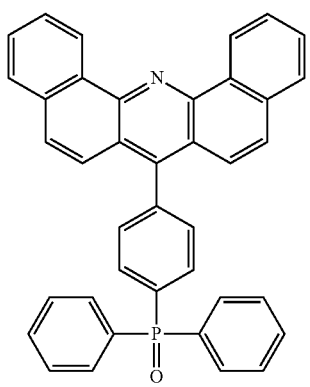 [SMILES: O=P(c1ccccc1)(c1ccccc1)c1ccc(-c2c3ccc4ccccc4c3nc3c2ccc2ccccc23)cc1]

(4-(dibenzo[c,h]acridin-7-yl)phenyl)diphenylphosphine oxide (described in WO2011/154131 A1), −2.20 V, C1;

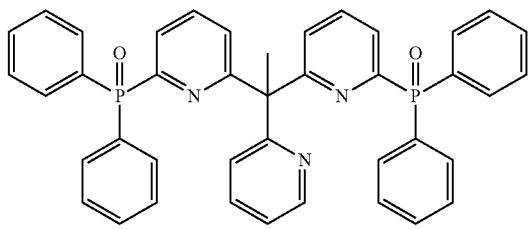 [SMILES: CC(c1ccccn1)(c1cccc(P(=O)(c2ccccc2)c2ccccc2)n1)c1cccc(P(=O)(c2ccccc2)c2ccccc2)n1]

(6,6'-(1-(pyridin-2-yl)ethane-1,1-diyl)bis(pyridine-6,2-diyl))bis(diphenylphosphine oxide), described in EP 2 452 946, −2.21 V, C2;

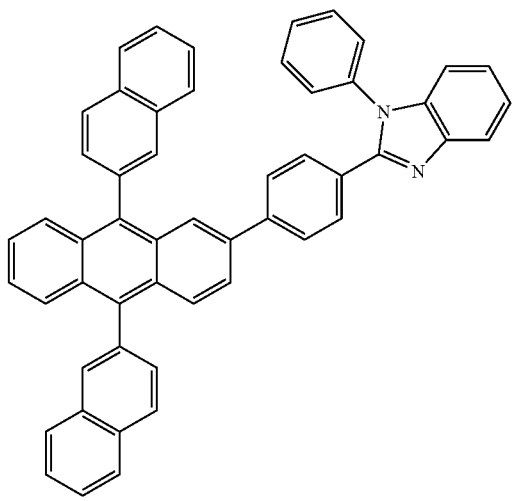 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

2-(4-(9,10-di(naphthalen-2-yl)anthracen-2-yl)phenyl)-1-phenyl-1H-benzo[d]imidazole (LG-201), CAS 561064-11-7, −2.32 V, C3;

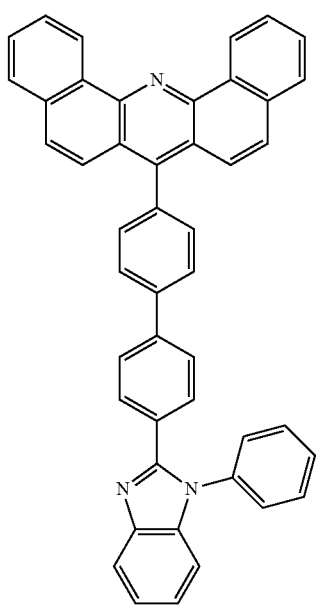 [SMILES: c1ccc(-n2c(-c3ccc(-c4ccc(-c5c6ccc7ccccc7c6nc6c5ccc5ccccc56)cc4)cc3)nc3ccccc32)cc1]

7-(4'-(1-phenyl-1H-benzo[d]imidazol-2-yl-[1'-biphenyl]-4-yl)dibenzo[c,h]acridine (described in WO2011/154131 A1), −2.24 V, C4;

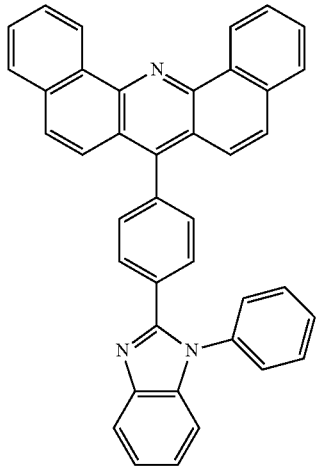 [SMILES: c1ccc(-n2c(-c3ccc(-c4c5ccc6ccccc6c5nc5c4ccc4ccccc45)cc3)nc3ccccc32)cc1]

7-(4'-(1-phenyl-1H-benzo[d]imidazol-2-yl)phenyl)dibenzo[c,h]acridine (described in WO2011/154131 A1), −2.22 V, C5;

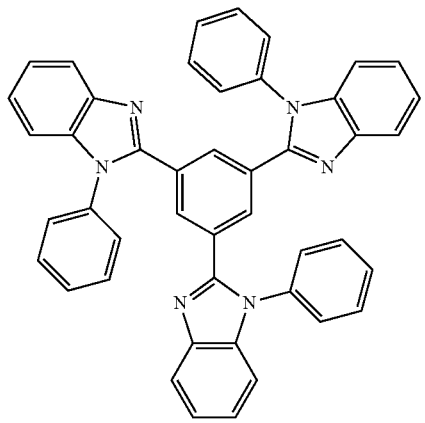 [SMILES: c1ccc(-n2c(-c3cc(-c4nc5ccccc5n4-c4ccccc4)cc(-c4nc5ccccc5n4-c4ccccc4)c3)nc3ccccc32)cc1]

1,3,5-tris(1-phenyl-1H-benzimidazol-2-yl)benzene (TPBI) CAS 192198-85-9, −2.58 V, C6;

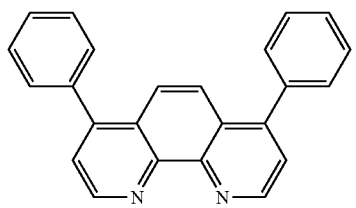 [SMILES: c1ccc(-c2ccnc3c2ccc2c(-c4ccccc4)ccnc23)cc1]

4,7-diphenyl-1,10-phenanthroline (Bphen) CAS 1662-01-7, −2.47 V, C7;

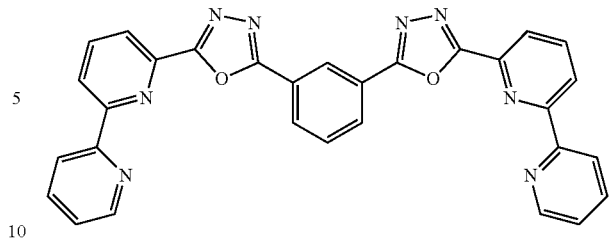

1,3-bis[2-(2,2'-bipyridine-6-yl)-1,3,4-oxadiazol-5-yl]benzene (Bpy-OXD), −2.28 V, C8;

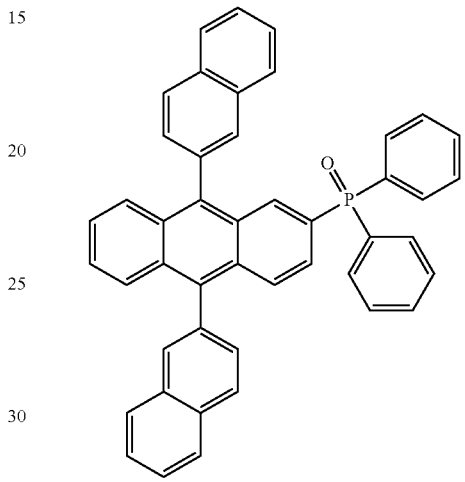

(9,10-di(naphthalen-2-yl)anthracen-2-yl)diphenylphosphine oxide, CAS 1416242-45-9, −2.19 V, C9;

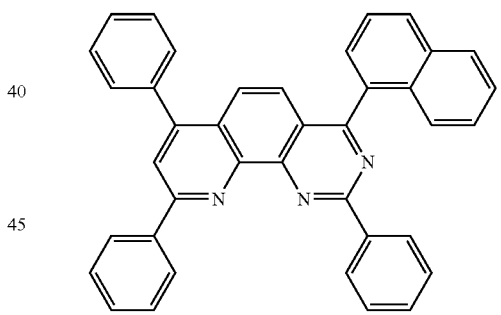

4-(naphtalen-1-yl)-2,7,9-triphenylpyrido[3,2-h]quinazoline, according to EP 1 971 371, −2.18 V, C10;

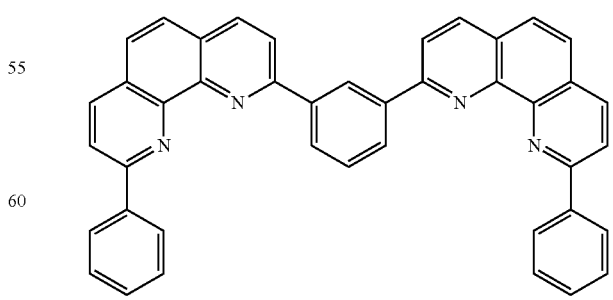

1,3-bis(9-phenyl-1,10-phenanthrolin-2-yl)benzene, CAS 721969-84-4, −2.45 V, C11.

Substrate

It can be flexible or rigid, transparent, opaque, reflective, or translucent. The substrate should be transparent or translucent if the light generated by the OLED is to be transmitted through the substrate (bottom emitting). The substrate may be opaque if the light generated by the OLED is to be emitted in the direction opposite of the substrate, the so called top-emitting type. The OLED can also be transparent. The substrate can be either arranged adjacent to the cathode or anode.

Electrodes

The electrodes are the anode and the cathode, they must provide a certain amount of conductivity, being preferentially conductors. Preferentially the "first electrode" is the cathode. At least one of the electrodes must be semi-transparent or transparent to enable the light transmission to the outside of the device. Typical electrodes are layers or a stack of layer, comprising metal and/or transparent conductive oxide. Other possible electrodes are made of thin busbars (e.g. a thin metal grid) wherein the space between the busbars is filled (coated) with a transparent material having certain conductivity, such as graphene, carbon nanotubes, doped organic semiconductors, etc.

In one embodiment, the anode is the electrode closest to the substrate, which is called non-inverted structure. In another mode, the cathode is the electrode closest to the substrate, which is called inverted structure.

Typical materials for the Anode are ITO and Ag. Typical materials for the cathode are Mg:Ag (10 vol % of Mg), Ag, ITO, Al. Mixtures and multilayer cathodes are also possible.

Preferably, the cathode comprises a metal selected from Ag, Al, Mg, Ba, Ca, Yb, In, Zn, Sn, Sm, Bi, Eu, Li, more preferably from Al, Mg, Ca, Ba and even more preferably selected from Al or Mg. Preferred is also a cathode comprising an alloy of Mg and Ag.

It is one of the advantages of the present invention that it enables broad selection of cathode materials. Besides metals with low work function which are in most cases necessary for good performance of devices comprising the state-of-the-art n-doped ETL materials, also other metals or conductive metal oxides may be used as cathode materials. Especially advantageous is the use of cathodes prepared of metallic silver, because neat silver provides the best reflectivity, and thus best efficiency, specifically e.g. in bottom emitting devices built on a transparent substrate and having an a transparent conductive oxide anode. Neat silver cathodes are not built into devices having undoped ETLs or ETLs doped with metal salt additives, because such devices show high operational voltages and low efficiencies due to poor electron injection.

It is equally well possible that the cathode is pre-formed on a substrate (then the device is an inverted device), or the cathode in a non-inverted device is formed by vacuum deposition of a metal or by sputtering.

Hole-Transporting Layer (HTL)

The HTL is a layer comprising a large gap semiconductor responsible to transport holes from the anode or holes from a CGL to the light emitting layer (LEL). The HTL is comprised between the anode and the LEL or between the hole generating side of a CGL and the LEL. The HTL can be mixed with another material, for example a p-dopant, in which case it is said the HTL is p-doped. The HTL can be comprised by several layers, which can have different compositions. P-doping of the HTL lowers its resistivity and avoids the respective power loss due to the otherwise high resistivity of the undoped semiconductor. The doped HTL can also be used as optical spacer, because it can be made very thick, up to 1000 nm or more without significant increase in resistivity.

Suitable hole transport matrices (HTM) can be, for instance compounds from the diamine class, where a delocalized pi-electron system conjugated with lone electron pairs on the nitrogen atoms is provided at least between the two nitrogen atoms of the diamine molecule. Examples are N4,N4'-di(naphthalen-1-yl)-N4,N4'-diphenyl-[1,1'-biphenyl]-4,4'-diamine (HTML), N4,N4, N4",N4"-tetra([1,1'-biphenyl]-4-yl)-[1':4',1"-terphenyl]-4,4"-diamine (HTM2). The synthesis of diamines is well described in literature; many diamine HTMs are readily commercially available.

Hole-Injecting Layer (HIL)

The HIL is a layer which facilitates the injection of holes from the anode or from the hole generating side of a CGL into an adjacent HTL. Typically, the HIL is a very thin layer (<10 nm). The hole injection layer can be a pure layer of p-dopant and can be about 1 nm thick. When the HTL is doped, an HIL may not be necessary, since the injection function is already provided by the HTL.

Light-Emitting Layer (LEL)

The light emitting layer must comprise at least one emission material and can optionally comprise additional layers. If the LEL comprises a mixture of two or more materials the charge carrier injection can occur in different materials for instance in a material which is not the emitter, or the charge carrier injection can also occur directly into the emitter. Many different energy transfer processes can occur inside the LEL or adjacent LELs leading to different types of emission. For instance excitons can be formed in a host material and then be transferred as singlet or triplet excitons to an emitter material which can be singlet or triplet emitter which then emits light. A mixture of different types of emitter can be provided for higher efficiency. White light can be realized by using emission from an emitter host and an emitter dopant. In one of preferred embodiments of the invention, the light emitting layer comprises at least one polymer.

Blocking layers can be used to improve the confinement of charge carriers in the LEL, these blocking layers are further explained in U.S. Pat. No. 7,074,500 B2.

Electron-Transporting Layer (ETL)

The ETL is a layer comprising a large gap semiconductor responsible for electron transport from the cathode or electrons from a CGL or EIL (see below) to the LEL. The ETL is comprised between the cathode and the LEL or between the electron generating side of a CGL and the LEL. The ETL can be mixed with an electrical n-dopant, in which case it is said the ETL is n-doped. The ETL can be comprised by several layers, which can have different compositions. Electrical n-doping the ETL lowers its resistivity and/or improves its ability to inject electrons into an adjacent layer and avoids the respective power loss due to the otherwise high resistivity (and/or bad injection ability) of the undoped semiconductor. If the used electrical doping creates new charge carriers in the extent that substantially increases conductivity of the doped semiconducting material in comparison with the undoped ETM, then the doped ETL can also be used as optical spacer, because it can be made very thick, up to 1000 nm or more without significant increase in the operational voltage of the device comprising such doped ETL. The preferable mode of electrical doping that is supposed to create new charge carriers is so called redox doping. In case of n-doping, the redox doping corresponds to the transfer of an electron from the dopant to a matrix molecule.

In case of electrical n-doping with metals used as dopants in their substantially elemental form, it is supposed that the electron transfer from the metal atom to the matrix molecule results in a metal cation and an anion radical of the matrix molecule. Hopping of the single electron from the anion radical to an adjacent neutral matrix molecule is the currently supposed mechanism of charge transport in redox n-doped semiconductors.

It is, however, hard to understand all properties of semiconductors n-doped with metals and, specifically, of semiconducting materials of present invention, in terms of electrical redox doping. It is therefore supposed that semiconducting materials of present invention advantageously combine redox doping with yet unknown favourable effects of mixing ETMs with metal atoms and/or their clusters. It is supposed that semiconducting materials of present invention contain a significant part of the added electropositive element in its substantially elemental form. The term "substantially elemental" shall be understood as a form that is, in terms of electronic states and their energies, closer to the state of a free atom or to the state of a cluster of metal atoms than to the state of a metal cation or to the state of a positively charged cluster of metal atoms.

Without being limited by theory, it can be supposed that there is an important difference between the n-doped organic semiconducting materials of previous art and the n-doped semiconducting materials of the present invention. In common organic ETMs of previous art (having reduction potentials roughly in the range between −2.0 and −3.0 V vs. Fc$^+$/Fc and comprising a conjugated system of at least ten delocalized electrons), the strong redox n-dopants like alkali metals or $W_2(hpp)_4$ are supposed to create the amounts of charge carriers that are commensurate to the number of individual atoms or molecules of the added dopant, and there is indeed an experience that increasing the amount of such strong dopant in conventional matrices above certain level does not bring any substantial gain in electrical properties of the doped material.

On the other hand, it is difficult to speculate which role shall the n-doping strength of the electropositive element play in the matrices of the present invention comprising primarily the polar groups but only very small or none conjugated systems of delocalized electrons.

It may be perhaps still supposed that in such matrices, even for the strongest electropositive element like alkali metals, only part of added atoms of the electropositive element added as the n-dopant reacts with matrix molecules by the redox mechanism under formation corresponding metal cations. It is rather supposed that even in high dilution, when the amount of the matrix is substantially higher than the amount of added metallic element, a substantial part of the metallic element is present in a substantially elemental form. It is further supposed that if the metallic element of the present invention is mixed with matrix of the present invention in a comparable amount, the majority of the added metallic element is present in the resulting doped semiconducting material in the substantially elemental form. This hypothesis seems to provide a reasonable explanation as to why the metallic elements of the present invention can be effectively used in significantly broader range of ratios to the doped matrix than the stronger dopants of previous art, even though they are weaker dopants. The applicable content of the metallic element in the doped semiconducting material of the present invention is roughly in the range from 0.5 weight % up to 25 weight %, preferably in the range from 1 to 20 weight %, more preferably in the range from 2 to 15 weight %, most preferably in the range from 3 to 10 weight %.

Hole blocking layers and electron blocking layers can be employed as usual.

Other layers with different functions can be included, and the device architecture can be adapted as known by the skilled in the art. For example, an Electron-Injecting Layer (EIL) made of metal, metal complex or metal salt can be used between the cathode and the ETL.

Charge Generation Layer (CGL)

The OLED can comprise a CGL which can be used in conjunction with an electrode as inversion contact, or as connecting unit in stacked OLEDs. A CGL can have the most different configurations and names, examples are pn-junction, connecting unit, tunnel junction, etc. Best examples are pn-junctions as disclosed in US 2009/0045728 A1, US 2010/0288362 A1. Metal layers and or insulating layers can also be used.

Stacked OLEDs

When the OLED comprises two or more LELs separated by CGLs, the OLED is called a stacked OLED, otherwise it is called a single unit OLED. The group of layers between two closest CGLs or between one of the electrodes and the closest CGL is called a electroluminescent unit (ELU). Therefore, a stacked OLED can be described as anode/$ELU_1/\{CGL_X ELU_{1+X}\}_X$/cathode, wherein x is a positive integer and each $CGL_X$ or each $ELU_{1+X}$ can be equal or different. The CGL can also be formed by the adjacent layers of two ELUs as disclosed in US2009/0009072 A1. Further stacked OLEDs are described e.g. in US 2009/0045728 A1, US 2010/0288362 A1, and references therein.

Deposition of Organic Layers

Any organic semiconducting layers of the inventive display can be deposited by known techniques, such as vacuum thermal evaporation (VTE), organic vapour phase deposition, laser induced thermal transfer, spin coating, blade coating, slot dye coating, inkjet printing, etc. A preferred method for preparing the OLED according to the invention is vacuum thermal evaporation. Polymeric materials are preferably processed by coating techniques from solutions in appropriate solvents.

Preferably, the ETL is formed by evaporation. When using an additional material in the ETL, it is preferred that the ETL is formed by co-evaporation of the electron transporting matrix (ETM) and the additional material. The additional material may be mixed homogeneously in the ETL. In one mode of the invention, the additional material has a concentration variation in the ETL, wherein the concentration changes in the direction of the thickness of the stack of layers. It is also foreseen that the ETL is structured in sub-layers, wherein some but not all of these sub-layers comprise the additional material.

In is supposed that semiconducting material of present invention contains a significant part of the added electropositive element in its substantially elemental form. Consequently, the process of the present invention requires that the electropositive element is vaporized from its elemental or substantially elemental form. In this context, the term "substantially elemental" shall be understood as a form that is, in terms of electronic states and their energies and in terms of chemical bonds, closer to the form of an elemental metal, of a free metal atom or to the form of a cluster of metal atoms, than to the form of a metal salt, of a covalent metal compound, or to the form of a coordination compound of a metal. Typically, metal vapour release from metal alloys according to EP 1 648 042 B1 or WO2007/109815 is understood as the evaporation from a substantially elemental form of the evaporated metal.

Electrical Doping

The most reliable and, at the same time, efficient OLEDs are OLEDs comprising electrically doped layers. Generally, the electrical doping means improving of electrical properties, especially the conductivity and/or injection ability of a doped layer in comparison with neat charge-transporting matrix without a dopant. In the narrower sense, which is usually called redox doping or charge transfer doping, hole transport layers are doped with a suitable acceptor material (p-doping) or electron transport layers with a donor material (n-doping), respectively. Through redox doping, the density of charge carriers in organic solids (and therefore the conductivity) can be increased substantially. In other words, the redox doping increases the density of charge carriers of a semiconducting matrix in comparison with the charge carrier density of the undoped matrix. The use of doped charge-carrier transport layers (p-doping of the hole transport layer by admixture of acceptor-like molecules, n-doping of the electron transport layer by admixture of donor-like molecules) in organic light-emitting diodes is, e.g., described in US 2008/203406 and U.S. Pat. No. 5,093,698.

US2008227979 discloses in detail the charge-transfer doping of organic transport materials, with inorganic and with organic dopants. Basically, an effective electron transfer occurs from the dopant to the matrix increasing the Fermi level of the matrix. For an efficient transfer in a p-doping case, the LUMO energy level of the dopant is preferably more negative than the HOMO energy level of the matrix or at least not more than slightly more positive, preferably not more than 0.5 eV more positive than the HOMO energy level of the matrix. For the n-doping case, the HOMO energy level of the dopant is preferably more positive than the LUMO energy level of the matrix or at least not more than slightly more negative, preferably not more than 0.5 eV lower compared to the LUMO energy level of the matrix. It is furthermore desired that the energy level difference for energy transfer from dopant to matrix is smaller than +0.3 eV.

Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N-Bis (naphthalen-1-yl)-N,N'-bis(phenyl)-benzidine) doped with F4TCNQ. α-NPD doped with 2,2'-(perfluoronaphthalene-2,6-diylidene) dimalononitrile (PD1). α-NPD doped with 2,2',2"-(cyclopropane-1,2,3-triylidene)tris(2-(p-cyanotetrafluorophenyl)acetonitrile) (PD2). All p-doping in the device examples of the present application was done with 3 mol % of PD2.

Typical examples of known redox doped electron transport materials are: fullerene C60 doped with acridine orange base (AOB); perylene-3,4,9,10-tetracarboxylic-3,4,9,10-di-anhydride (PTCDA) doped with leuco crystal violet; 2,9-di (phenanthren-9-yl)-4,7-diphenyl-1,10-phenanthroline doped with tetrakis (1,3,4,6,7,8-hexahydro-2H-pyrimido [1,2-a] pyrimidinato) ditungsten (II) (W$_2$(hpp)$_4$); naphthalene tetracarboxylic acid di-anhydride (NTCDA) doped with 3,6-bis-(dimethyl amino)-acridine; NTCDA doped with bis (ethylene-dithio) tetrathiafulvalene (BEDT-TTF).

Besides the redox dopants, certain metal salts can be alternatively used for electrical n-doping resulting in lowering operational voltage in devices comprising the doped layers in comparison with the same device without metal salt. True mechanism how these metal salts, sometimes called "electrically doping additives", contribute to the lowering of the voltage in electronic devices, is not yet known.

It is believed that they change potential barriers on the interfaces between adjacent layers rather than conductivities of the doped layers, because their positive effect on operational voltages is achieved only if layers doped with these additives are very thin. Usually, the electrically undoped or additive doped layers are thinner than 50 nm, preferably thinner than 40 nm, more preferably thinner than 30 nm, even more preferably thinner than 20 nm, most preferably thinner than 15 nm. If the manufacturing process is precise enough, the additive doped layers can be advantageously made thinner than 10 nm or even thinner than 5 nm.

Typical representatives of metal salts which are effective as second electrical dopants in the present invention are salts comprising metal cations bearing one or two elementary charges. Favourably, salts of alkali metals or alkaline earth metals are used. The anion of the salt is preferably an anion providing the salt with sufficient volatility, allowing its deposition under high vacuum conditions, especially in the temperature and pressure range which is comparable with the temperature and pressure range suitable for the deposition of the electron transporting matrix.

Example of such anion is 8-hydroxyquinolinolate anion. Its metal salts, for example lithium 8-hydroxyquinolinolate (LiQ) represented by the formula D1

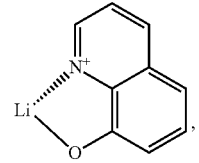

D1 are well known as electrically doping additives.

Another class of metal salts useful as electrical dopants in electron transporting matrices of the present invention represent compounds disclosed in the application PCT/EP2012/074127 (WO2013/079678), having general formula (II)

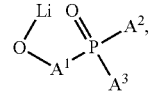

Formula (II)

wherein A$^1$ is a C$_6$-C$_{20}$ arylene and each of A$^2$-A$^3$ is independently selected from a C$_6$-C$_{20}$ aryl, wherein the aryl or arylene may be unsubstituted or substituted with groups comprising C and H or with a further LiO group, provided that the given C count in an aryl or arylene group includes also all substituents present on the said group. It is to be understood that the term substituted or unsubstituted arylene stands for a divalent radical derived from substituted or unsubstituted arene, wherein the both adjacent structural moieties (in formula (I), the OLi group and the diaryl prosphine oxide group) are attached directly to an aromatic ring of the arylene group. In examples of the present application, this class of dopants is represented by compound D2

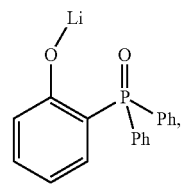

D2 wherein Ph is phenyl.

Yet another class of metal salts use electrical dopants in electron transporting matrices of the present invention represent compounds disclosed in the application PCT/EP2012/074125 (WO2013/079676), having general formula (III)

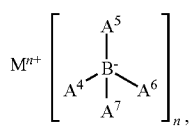

Formula (III)

wherein M is a metal ion, each of $A^4$-$A^7$ is independently selected from H, substituted or unsubstituted $C_6$-$C_{20}$ aryl and substituted or unsubstituted $C_2$-$C_{20}$ heteroaryl and n is valence of the metal ion. In examples of the present application, this class of dopants is represented by compound D3

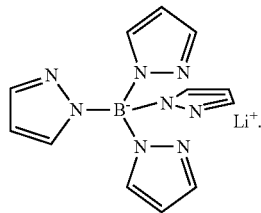

D3

V. ADVANTAGEOUS EFFECT OF THE INVENTION

The favourable effects of the inventive electrically doped semiconducting materials are shown in comparison with comparative devices comprising instead of the inventive combination of electron transporting matrices and dopants other combinations of matrices and dopants known in the art. The used devices are described in detail in examples.

In the first screening phase, there were in device of example 1 tested 32 matrix compounds with 5 wt % Mg as dopant. Electron transport matrices comprising phosphine oxide matrices and having their LUMO level expressed in terms of their reduction potential vs. $Fc^+/Fc$ (measured by cyclic voltammetry in THF) higher than compound B0 (−2.21 V under standardized conditions used) performed better C1 and C2, in terms of operational voltage and/or quantum efficiency of the device, and significantly better than matrices lacking the phosphine oxide group, irrespective of their LUMO level. These observations were confirmed also for several other divalent metals, namely Ca, Sr, Ba, Sm and Yb.

The results are summarized in Table 1, wherein relative change of voltage and efficiency (both measured at current density 10 mA/cm$^2$) is calculated against the C2/Mg system of previous en the reference. The overall score is calculated by subtraction of relative voltage change from relative change of efficiency.

TABLE 1

| ETL matrix | ETL dopant | wt % dopant | U (V) | $(U - U_{ref})/U_{ref}$ (%) | EQE (%) | $(EQE - EQE_{ref})/EQE_{ref}$ (%) | score |
|---|---|---|---|---|---|---|---|
| E1 | Mg | 5 | 3.2 | −40 | 5.15 | −9 | +31 |
| E1 | Ca | 1 | 3.497 | −35 | 5.415 | −4 | +31 |
| E1 | Ca | 5 | 3.633 | −32 | 5.235 | −7 | +25 |
| E1 | Ba | 1 | 3.577 | −33 | 6.090 | +8 | +41 |
| E1 | Ba | 5 | 3.491 | −35 | 5.560 | −1 | +34 |
| E2 | Mg | 5 | 3.56 | −34 | 5.33 | −5 | +29 |
| E2 | Ca | 1 | 3.245 | −39 | 5.750 | +2 | +41 |
| E2 | Ca | 5 | 3.83 | −29 | 5.83 | +4 | +33 |
| E2 | Ba | 1 | 6.104 | +13 | 6.245 | +14 | +1 |
| E2 | Ba | 5 | 3.293 | −39 | 6.055 | +8 | +47 |
| E3 | Mg | 5 | 3.68 | −31 | 4.68 | −17 | +14 |
| E4 | Mg | 5 | 3.6 | −33 | 3.9 | −31 | +2 |
| E4 | Ca | 2 | 3.490 | −35 | 5.900 | +5 | +40 |
| E4 | Ba | 2 | 4.020 | −25 | 6.150 | +9 | +34 |
| E4 | Sm | 2 | 3.806 | −29 | 5.600 | 0 | +29 |
| E4 | Yb | 2 | 3.844 | −28 | 5.390 | −4 | +24 |
| E5 | Mg | 5 | 3.29 | −29 | 5.45 | −3 | +26 |
| E6 | Mg | 5 | 3.53 | −34 | 7.73 | +38 | +72 |
| E6 | Ca | 2 | 3.350 | −37 | 5.650 | +0 | +37 |
| E6 | Ba | 2 | 3.710 | −31 | 6.320 | +12 | +43 |
| E6 | Sm | 2 | 3.429 | −36 | 6.040 | +7 | +43 |
| E6 | Yb | 2 | 3.427 | −36 | 5.965 | +6 | +42 |
| E7 | Mg | 5 | 5.2 | −3 | 6.48 | +15 | +18 |
| E8 | Mg | 5 | 3.36 | −37 | 5.6 | 0 | +37 |
| E8 | Ca | 2 | 3.26 | −39 | 5.24 | −7 | +32 |
| E8 | Ba | 2 | 3.329 | −38 | 5.990 | +6 | +44 |
| E9 | Mg | 5 | 4.51 | −16 | 7.5 | +33 | +49 |
| E10 | Mg | 5 | 3.81 | −29 | 4.7 | −17 | +12 |
| E11 | Mg | 5 | 3.88 | −28 | 4.53 | −20 | +8 |
| E11 | Sr | 1 | 3.642 | −32 | 5.500 | −2 | +30 |
| E11 | Sr | 3 | 3.653 | −32 | 5.075 | −10 | +22 |
| E11 | Sm | 2 | 4.113 | −23 | 5.365 | −5 | +18 |
| E11 | Sm | 5 | 4.067 | −24 | 4.435 | −21 | +3 |
| E11 | Yb | 2 | 3.693 | −31 | 5.485 | −3 | +28 |
| E11 | Yb | 5 | 3.796 | −29 | 5.105 | −9 | +20 |
| B6 | Mg | 5 | 3.44 | −36 | 4.00 | −29 | +7 |
| B2 | Mg | 5 | 5.67 | +5 | 0.66 | −89 | −94 |
| B4 | Ca | 2 | 7.549 | +40 | 0.49 | −92 | −132 |

TABLE 1-continued

| ETL matrix | ETL dopant | wt % dopant | U (V) | (U − U$_{ref}$)/U$_{ref}$ (%) | EQE (%) | (EQE − EQE$_{ref}$)/EQE$_{ref}$ (%) | score |
|---|---|---|---|---|---|---|---|
| B4 | Ba | 2 | 9.784 | +82 | 2.260 | −60 | −142 |
| B4 | Sm | 2 | 7.993 | +48 | 1.400 | −75 | −123 |
| B4 | Yb | 2 | 8.689 | +65 | 1.960 | −65 | −130 |
| C1 | Mg | 5 | 4.2 | −22 | 2.6 | −54 | −32 |
| C2 | Mg | 5 | 5.4 | 0 | 5.6 | 0 | 0 |
| C3 | Mg | 5 | 7.11 | +32 | 0.85 | −85 | −117 |
| C4 | Mg | 5 | 8.3 | +54 | 2.32 | −59 | −114 |
| C5 | Mg | 5 | 6.8 | +26 | 2.9 | −49 | −75 |
| C6 | Mg | 5 | 8.78 | +63 | 3.78 | −33 | −96 |
| C6 | Ca | 2 | 5.500 | +2 | 4.045 | −28 | −30 |
| C6 | Ba | 2 | 7.101 | +32 | 3.865 | −31 | −63 |
| C6 | Sm | 2 | 8.167 | +52 | 2.355 | −58 | −110 |
| C6 | Yb | 2 | 8.130 | +51 | 3.075 | −46 | −97 |
| C7 | Mg | 5 | 4.17 | −22 | 0.9 | −84 | −62 |
| C7 | Sm | 2 | 5.362 | 0 | 1.680 | −70 | −70 |
| C7 | Yb | 2 | 5.866 | +9 | 1.890 | −67 | −76 |
| C8 | Mg | 5 | 4.17 | −22 | 1.04 | −82 | −60 |
| C9 | Mg | 5 | 4.2 | −22 | 1 | −83 | −61 |
| D1 | Ca | 2 | 6.731 | +25 | 2.230 | −61 | −86 |
| D1 | Ba | 2 | 8.515 | +58 | 2.295 | −60 | −118 |
| D1 | Sm | 2 | 7.972 | +48 | 2.250 | −60 | −108 |
| D1 | Yb | 2 | 8.006 | +49 | 2.765 | −51 | −100 |

In the second phase of the research, various metals were tested in device 2 in matrices E1, E2 and C1, with two different ETL thicknesses 40 nm ($U_1$ and $U_3$) and 80 nm ($U_2$ and $U_4$) and with two different doping concentrations 5 wt % ($U_1$ and $U_2$) and 25 wt % ($U_3$ and $U_4$), all for current density 10 mA/cm$^2$.

The results summarized in Table 2 led to a preliminary conclusion that metals that are able to form stable compounds in oxidation state II are especially appropriate for n-doping in phosphine oxide matrices despite their significantly lower reactivity and higher air stability in comparison with the least reactive alkali metal (Li). From the divalent metals tested, only zinc having extremely high sum of the first and second ionization potential failed as n-dopant, whereas aluminium with typical oxidation state III gave reasonably low operational voltages only if present in the doped ETL in the high 25 wt % concentration that afforded ETLs with impractically high light absorption. Transmittance assigned as "OD" that stands for "optical density" is reported in Table 2 only for 25 wt % doping concentration (OD$_3$ for layer thickness 40 nm and OD$_4$ for layer thickness 80), as the measurements for lower doping concentrations suffered from bad reproducibility.

The typically trivalent bismuth failed as n-dopant completely, despite its ionization potential does not differ much, e.g. from manganese that showed, quite surprisingly, good doping action at least in E1.

Low values of differences $U_1$-$U_2$ and $U_3$-$U_4$ can be assigned to doped materials having high conductivity (voltage of the device depends only weakly on the thickness of the doped layer).

TABLE 2

| ETL matrix | ETL dopant | $U_1$ (V) | $U_2$ (V) | $U_1$ − $U_2$ (V) | $U_3$ (V) | $U_4$ (V) | $U_3$ − $U_4$ (V) | OD$_3$ | OD$_4$ |
|---|---|---|---|---|---|---|---|---|---|
| E$_1$ | Li | 9.042 | >10 | na | 5.814 | 6.666 | 0.853 | 38 | 43 |
| E$_1$ | Na | 2.863 | 2.864 | 0.001 | 5.354 | 7.186 | 1.832 | 70 | 64 |
| E$_1$ | Mg | 2.954 | 2.970 | 0.016 | 2.965 | 2.960 | 0.005 | 62 | 33 |
| E$_1$ | Ca | 4.625 | 4.340 | −0.286 | 5.590 | 9.081 | 3.491 | 63 | 52 |
| E$_1$ | Sr | 3.650 | 3.700 | 0.050 | — | — | — | — | — |
| E$_1$ | Ba | 4.085 | 4.023 | −0.062 | 4.360 | 4.567 | 0.207 | 67 | 73 |
| E$_1$ | Sm | 3.138 | 3.136 | −0.002 | 7.889 | — | — | 63 | 61 |
| E$_1$ | Eu | — | — | — | 4.090 | 4.119 | 0.029 | — | — |
| E$_1$ | Yb | 3.022 | 3.032 | 0.009 | 5.578 | 6.932 | 1.354 | 66 | 68 |
| E$_1$ | Mn | 3.38 | 3.40 | 0.017 | — | — | — | — | — |
| E$_1$ | Zn | 6.124 | 8.842 | 2.718 | 5.592 | 7.545 | 1.954 | 65 | 76 |
| E$_1$ | Al | 7.614 | >10 | na | 3.321 | 3.301 | −0.020 | 48 | 31 |
| E$_1$ | Bi | 6.129 | 8.768 | 2.640 | 5.430 | 7.275 | 1.845 | 56 | 54 |
| E$_2$ | Li | 6.333 | 8.362 | 2.029 | 3.307 | 3.324 | 0.017 | 51 | 32 |
| E$_2$ | Na | 3.735 | 4.533 | 0.798 | >10 | >10 | na | 65 | 38 |
| E$_2$ | Mg | 3.189 | 3.232 | 0.043 | 3.464 | 3.489 | 0.025 | 68 | 72 |
| E$_2$ | Ca | 4.426 | 4.503 | 0.078 | 3.911 | 4.501 | 0.590 | 64 | 50 |
| E$_2$ | Sr | 3.842 | 3.832 | −0.010 | — | — | — | — | — |
| E$_2$ | Ba | 2.929 | 2.935 | 0.006 | 3.397 | 3.397 | 0.000 | 74 | 71 |
| E$_2$ | Sm | 3.610 | 3.894 | 0.284 | 6.053 | 7.939 | 1.887 | 72 | 63 |
| E$_2$ | Eu | — | — | — | 4.516 | 4.838 | 0.322 | — | — |
| E$_2$ | Yb | 2.932 | 2.933 | 0.001 | 5.442 | 6.625 | 1.183 | 73 | 65 |
| E$_2$ | Mn | 6.02 | 8.09 | 0.99 | — | — | — | — | — |
| E$_2$ | Zn | 7.898 | >10 | na | 7.000 | >10 | na | 66 | 71 |
| E$_2$ | Al | 8.650 | >10 | na | 3.203 | 3.196 | −0.007 | 39 | 27 |
| E$_2$ | Bi | 7.814 | >10 | na | 7.173 | >10 | na | 64 | 61 |

TABLE 2-continued

| ETL matrix | ETL dopant | $U_1$ (V) | $U_2$ (V) | $U_1 - U_2$ (V) | $U_3$ (V) | $U_4$ (V) | $U_3 - U_4$ (V) | $OD_3$ | $OD_4$ |
|---|---|---|---|---|---|---|---|---|---|
| C1 | Li | 6.997 | >10 | na | 6.209 | 8.314 | 2.105 | 72 | 48 |
| C1 | Na | — | — | — | 4.417 | 4.455 | 0.037 | 56 | 31 |
| C1 | Mg | 4.180 | 4.178 | −0.002 | 4.174 | 4.167 | −0.007 | 62 | 57 |
| C1 | Ca | 4.031 | 4.104 | 0.074 | 3.619 | 3.616 | −0.004 | 38 | 21 |
| C1 | Sr | 4.033 | 4.071 | 0.0038 | — | — | — | — | — |
| C1 | Ba | 3.916 | 3.909 | −0.006 | 3.969 | 4.605 | 0.636 | 63 | 39 |
| C1 | Sm | 4.208 | 4.207 | 0.000 | 4.106 | 4.104 | −0.002 | 63 | 48 |
| C1 | Eu | 3.972 | 3.984 | 0.012 | — | — | — | — | — |
| C1 | Yb | 4.017 | 4.167 | −0.003 | 4.148 | 4.173 | 0.025 | 33 | 29 |
| C1 | Mn | 4.27 | 4.26 | −0.01 | — | — | — | — | — |
| C1 | Zn | 5.084 | 7.758 | 2.674 | 4.699 | 6.402 | 1.703 | 57 | 50 |
| C1 | Al | 4.152 | 4.949 | 0.797 | 3.135 | 3.123 | −0.011 | 45 | 26 |
| C1 | Bi | 4.842 | 6.355 | 1.513 | 4.306 | 4.603 | 0.297 | 59 | 68 |

It has been observed that in matrices with deep LUMO, like C1, the operational voltage is often surprisingly higher than in devices comprising matrices with the LUMO levels in the range according to invention, despite good conductivity of many doped semiconducting materials based on C1. Apparently, the good conductivity of a semiconducting material is not a sufficient condition for low operational voltage of the device comprising it. Based on this finding, it is supposed that doped semiconducting materials according to this invention enable, besides the reasonable conductivity, also efficient charge injection from the doped layer in the adjacent layer.

In the third research phase, the observed effects were confirmed in OLEDs of example 3 comprising alternative emitter systems and further embodiments of the invention described in examples 4-7 were implemented. The achieved results summarized in the Table 3 confirmed the surprising superiority of phosphine oxide ETL matrices having higher LUMO levels (closer to vacuum level), despite these matrices should be more difficult to dope with the relatively weakly reducing metals used in the present invention in comparison with the phosphine oxide matrices of the previous art (like C1) which were thought to be dopable with Mg owing to their deeper LUMO (further away from vacuum level) and specific structure comprising the metal complexing unit.

This series of experiments confirmed that also with other emitters, the matrix compounds like E1 and E2 having rather high LUMO energy levels perform better than other phosphine oxide matrix compounds, and much better in comparison with matrices lacking the phosphine oxide group.

These results showed that if combined with phosphine oxide matrices having sufficiently high LUMO levels, even substantially air stable metals, possessing moreover further technically advantageous features like good evaporability, can afford electrically doped semiconductive materials and devices that perform equally well or even better than devices available in art.

TABLE 3

| LEL | ETL matrix | ETL dopant | wt % dopant | U (V) | $(U - U_{ref})/U_{ref}$ (%) | EQE (%) | $(EQE - EQE_{ref})/EQE_{ref}$ (%) | score |
|---|---|---|---|---|---|---|---|---|
| ABH-112/ NUBD-369 | E1 | Mg | 5 | 3.498 | −35 | 6.640 | +18 | +53 |
| | E2 | Mg | 5 | 3.751 | −30 | 5.975 | +6 | +36 |
| | C1 | Mg | 5 | 4.545 | −15 | 3.905 | −30 | −15 |
| | C10 | Mg | 5 | — | — | 0 | no light | — |
| Two-colour fluoresc. white* | E1 | Mg | 5 | 3.480 | −35 | 7.660 | +36 | +71 |
| | E2 | Mg | 5 | 3.83 | −29 | 6.67 | +19 | +48 |
| | C1 | Mg | 5 | 4.970 | −8 | 4.470 | −20 | −12 |
| | C10 | Mg | 5 | 6.950 | +28 | 0.820 | −85 | −113 |
| Spiro-Pye/ BCzVB | E1 | Mg | 5 | 3.331 | −38 | 6.19 | +10 | +48 |
| | E1 | Ca | 5 | 3.311 | −38 | 4.46 | −20 | +18 |
| | E1 | Ba | 12 | 3.087 | −42 | 3.44 | −39 | +3 |
| | E1 | Sm | 5 | 3.318 | −38 | 4.53 | −19 | +19 |
| | E2 | Mg | 5 | 3.480 | −35 | 6.08 | +8 | +43 |
| | E2 | Ca | 5 | 3.497 | −35 | 3.56 | −37 | +1 |
| | E2 | Ba | 5 | 3.090 | −42 | 3.59 | −36 | +6 |
| | C7 | Mg | 5 | 3.679 | −31 | 0.32 | −94 | −63 |
| | C7 | Ca | 5 | 3.647 | −33 | 0.52 | −90 | −57 |

*ABH-112/NUBD-369 + ABH-036/NRD129 (Sun Fine Chemicals)

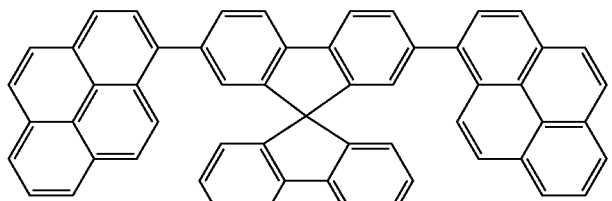

Spiro-Pye

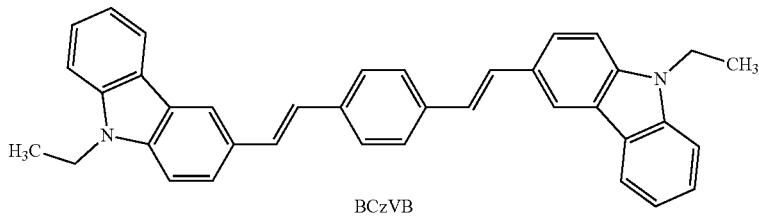

BCzVB

Finally, the focus returned to the starting point. The remaining goal was to make the redox potential of the comparative compound C2 significantly more negative, and test whether the corresponding LUMO level approaching closer to the zero in absolute energy scale has in phosphine oxide compounds comprising a small conjugated system of less than 10 delocalized electrons similarly positive effects as in the matrix compounds described above. This task was accomplished relatively easily with commercially available compounds A1-A4.

All these compounds have redox potentials that are difficult to measure by the standard procedure using THF as a solvent, because their values are more negative than for compound B7.

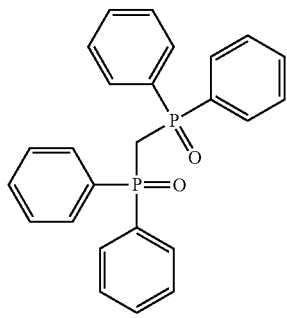 [SMILES: O=P(CP(=O)(c1ccccc1)c1ccccc1)(c1ccccc1)c1ccccc1]

methylenebis(diphenylphosphine oxide), A1

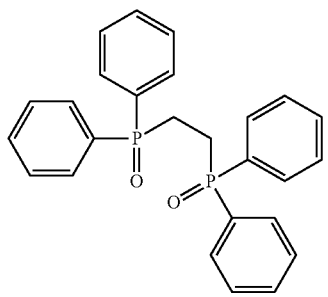 [SMILES: O=P(CCP(=O)(c1ccccc1)c1ccccc1)(c1ccccc1)c1ccccc1]

ethane-1,2-diylbis(diphenylphosphine oxide), A2

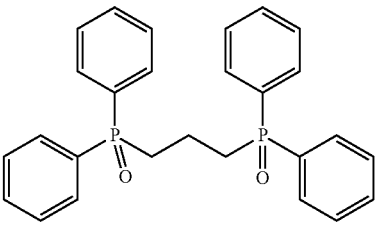 [SMILES: O=P(CCCP(=O)(c1ccccc1)c1ccccc1)(c1ccccc1)c1ccccc1]

propane-1,3-diylbis(diphenylphosphine oxide), A3

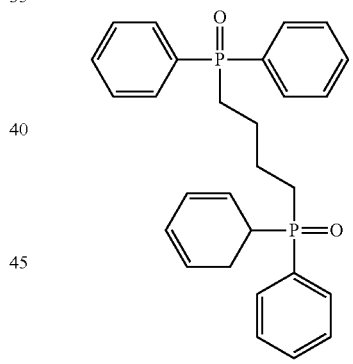

butane-1,4-diylbis(diphenylphosphine oxide), A4.

Based on mostly discouraging results of previous experiments with C2 analogs and salt additives, rather negative results were expected from metal doping in matrices which are free of a conjugated system of delocalized electrons or comprising less than 10 delocalized electrons in a conjugated system. Contrary to these expectations, it was surprisingly found that sufficiently strong dopants can provide semiconducting materials of good quality even with compounds having conjugated systems of delocalized electrons that are as small as mere six-electron Mickel systems in isolated aromatic or heteroaromatic rings, provided that the compound still comprises polar groups selected from phosphine oxide and diazole. Subsequently, it was confirmed that such simple two-component semiconducting materials consisting of metal and the first compound according to present invention can be advantageously mixed with a second compound comprising larger conjugated systems of delocalized electrons without loss of performance, even though the second compound does not comprise any polar group at all. It was further surprisingly found that, contrary to previous experience with electron transport compounds comprising both polar group and the conjugated system of at least ten delocalized electrons, in matrices according to present invention, comprising polar group and a conjugated system of less than 10 delocalized electrons or free of the conjugated system of delocalized electrons, there is no significant difference anymore between the doping performance of divalent electropositive metals on one hand and other electropositive metals like alkali metals and typically trivalent rare earth metals like Sc, Y, La or Lu on the other hand. In this sense, it seems unnecessary to make any speculations about the extent of charge transfer between the doping electropositive element and the matrix and try to divide the electropositive elements used as n-dopants in semiconducting materials according to invention in groups of "strong" and "weak" dopants. It is, therefore, supposed that the electropositive element is still at least partially present in its substantially elemental form in the inventive semiconducting materials, and that the favourable results observed in matrices comprising polar phosphine oxide or diazole groups are to be linked to specific interactions of these polar groups with atoms or atom clusters of the electropositive element.

VI. EXAMPLES

Auxiliary Materials

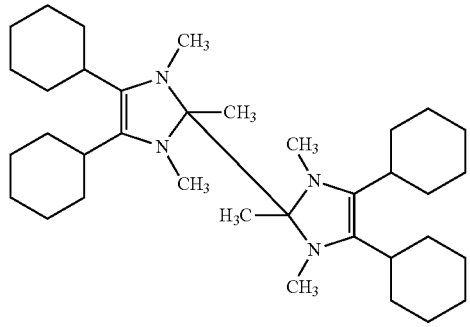 [SMILES: CN1C(C2CCCCC2)=C(C2CCCCC2)N(C)C1(C)C1(C)N(C)C(C2CCCCC2)=C(C2CCCCC2)N1C]

4,4',5,5'-tetracyclohexyl-1,1',2,2',3,3'-hexamethyl-2, 2',3,3'-tetrahydro-1H, 1'H-biimidazole, CAS 1253941-73-9, F1;

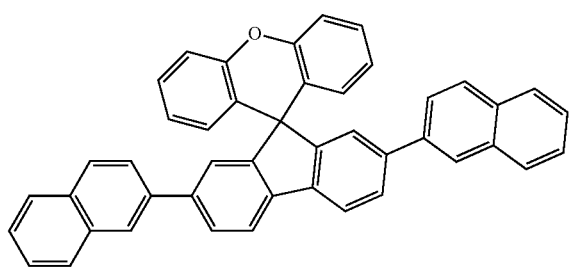 [SMILES: c1ccc2c(c1)Oc1ccccc1C21c2cc(-c3ccc4ccccc4c3)ccc2-c2ccc(-c3ccc4ccccc4c3)cc21]

2,7-di(naphtalen-2-yl)spiro[fluorene-9,9'-xanthene], LUMO (CV vs. Fc$^+$/Fc) −2.63 V, WO2013/149958, F2;

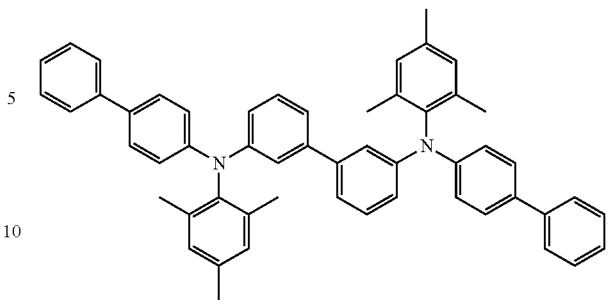

N3,N3'-di([1,1'-biphenyl]-4-yl)-N3,N3'-dimesityl-[1,1'-biphenyl]-3,3'-diamine, WO2014/060526, F3;

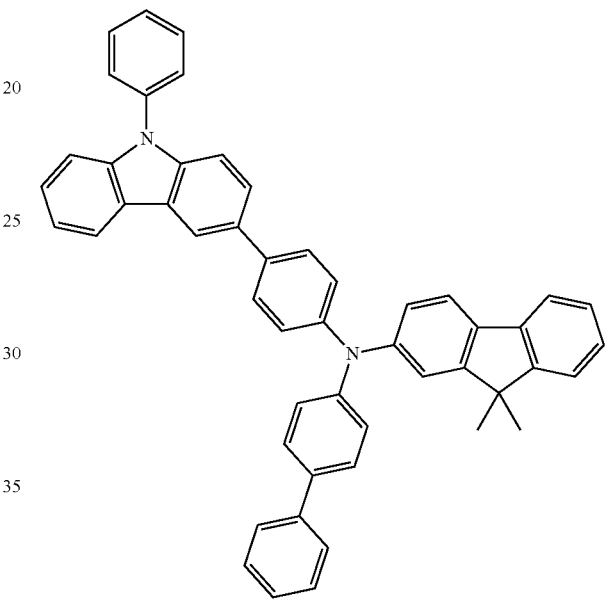

biphenyl-4-yl(9,9-diphenyl-9H-fluoren-2-yl)-[4-(9-phenyl-9H-carbazol-3-yl)phenyl]-amine, CAS 1242056-42-3, F4;

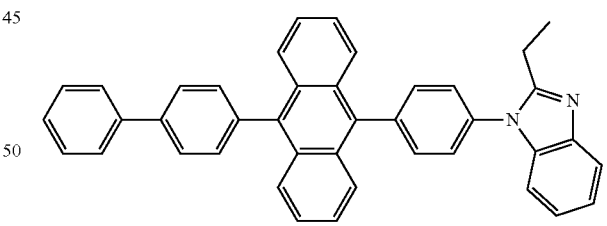

1-(4-(10-(([1,1'-biphenyl]-4-yl)anthracen-9-yl)phenyl)-2-ethyl-1H-benzo[d]imidazole, CAS 1254961-38-0, F5;

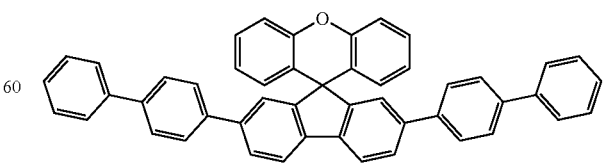

2,7-di([1,1'-biphenyl]-4-yl)spiro[fluorene-9,9'-xanthene], LUMO (CV vs. Fc$^+$/Fc) −2.63 V, WO02013/149958, CAS 1466444-48-3, F6.

Auxiliary Procedures

The redox potentials given at particular compounds were measured in an argon-deaerated, dry 0.1M THF solution of the tested substance, under argon atmosphere, with 0.1M tetrabutylammonium hexafluorophosphate supporting electrolyte, between platinum working electrodes and with an Ag/AgCl pseudo-standard electrode, consisting of a silver wire covered by silver chloride and immersed directly in the measured solution, with the scan rate 100 mV/s. The first run was done in the broadest range of the potential set on the working electrodes, and the range was then adjusted within subsequent runs appropriately. The final three runs were done with the addition of ferrocene (in 0.1M concentration) as the standard. The average of potentials corresponding to cathodic and anodic peak of the studied compound, after subtraction of the average of cathodic and anodic potentials observed for the standard $Fc^+/Fc$ redox couple, afforded finally the values reported above. All studied phosphine oxide compounds as well as the reported comparative compounds showed well-defined reversible electrochemical behaviour.

SYNTHESIS EXAMPLES

The synthesis of phosphine oxide ETL matrix compounds is well described in many publications, besides the literature cited at particular compounds listed above and describing typical multistep procedures used for these compounds, the compound E6 was prepared, according to Bull. Chem. Soc. Jpn., 76, 1233-1244 (2003), quite specifically by an anionic rearrangement of the compound E2.

For yet unpublished compounds, the typical procedures were used, as exemplified below specifically for the compounds E5 and E8. All synthesis steps were carried out under argon atmosphere. Commercial materials were used without additional purification. Solvents were dried by appropriate means and deaerated by saturation with argon.

Synthesis Example 1

[1,1':4',1"-terphenyl]-3,5-diylbis-diphenylphosphine oxide (Comparative Compound E5)

Step 1: 3,5-dibromo-1,1':4',1"-terphenyl

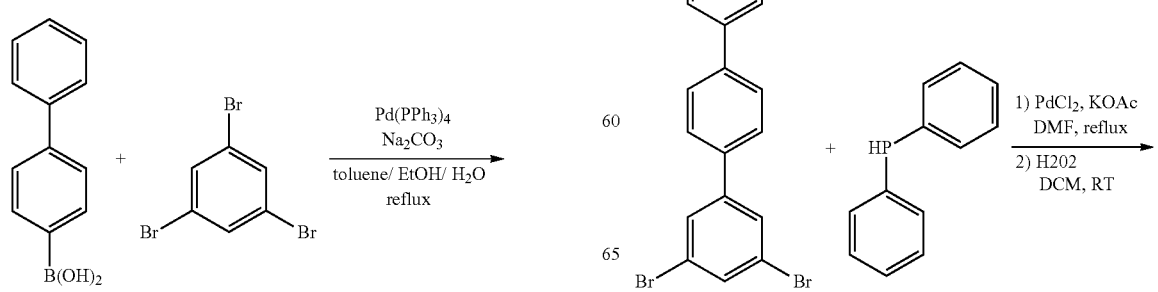

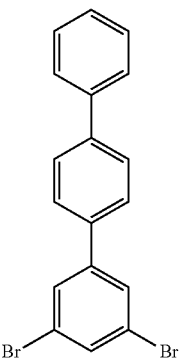

All components (10.00 g (1.0 eq, 50.50 mmol) [1,1'-biphenyl]-4-yl-boronic acid, 23.85 g (1.5 eq, 75.75 mmol) 1,3,5-tribromobenzene, 1.17 g (2.0 mol %, 1.01 mmol) tetrakis(triphenyl phosphine)palladium(0), 10.70 g (2 eq, 101 mmol) sodium carbonate in 50 mL water, 100 mL ethanol and 310 mL toluene) were mixed together and stirred at reflux for 21 hours. The reaction mixture was cooled to room temperature and diluted with 200 mL toluene (three layers appear). The aqueous layer was extracted with 100 mL toluene, the combined organic layers were washed with 200 mL water, dried and evaporated to dryness. The crude material was purified via column chromatography ($SiO_2$, hexane/DCM 4:1 v/v) The combined fractions were evaporated, suspended in hexane and filtered off to give 9.4 g of a white glittering solid (yield 48%, HPLC purity 99.79%).

Step 2: [1,1':4',1"-terphenyl]-3,5-diylbis-diphenylphosphine oxide

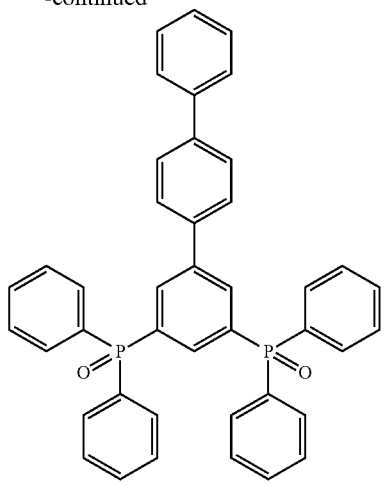

All components (5.00 g (1.0 eq, 12.9 mmol) 3,5-dibromo-1,1':4',1''-terphenyl from the previous step, 12.0 g (5.0 eq, 64.4 mmol) diphenyl phosphine, 114 mg (5 mol %, 6.44× $10^{-4}$ mol) palladium(II) chloride, 3.79 g (3.0 eq, 38.6 mmol) potassium acetate and 100 mL N,N-dimethylformamide) were mixed together and stirred at reflux for 21 hours. Then the reaction mixture was cooled to room temperature; water was added (100 mL) and the mixture was stirred for 30 min, then filtered off. The solid was re-dissolved in DCM (100 mL), $H_2O_2$ (30 wt % aqueous solution) was added dropwise, and the solution was stirred overnight at room temperature. Then the organic layer was decanted, washed with water (100 mL) twice, dried over $MgSO_4$, and evaporated to dryness. The resulting oil was triturated in hot MeOH (100 mL) which induced the formation of a solid. After filtration hot, the resulting solid was rinsed with MeOH and dried, yielding 9.7 g of crude product. The crude material was re-dissolved in DCM and chromatographed on a short silica column, elution with ethyl acetate. After evaporation of the eluate to dryness, the resulting solid was triturated in hot MeOH (100 mL), followed by trituration in hot ethyl acetate (50 mL). After drying, the desired compound was obtained in 70% yield (5.71 g). Finally, the product was purified using vacuum sublimation.

The pure sublimed compound was amorphous, with no detectable melting peak on the DSC curve, glass transition onset at 86° C., and s ed to decompose at 490° C.

Synthesis Example 2

(9,9-dihexyl-9H-fluorene-2,7-diyl)bis-diphenylphosphine oxide (Comparative Compound E8)

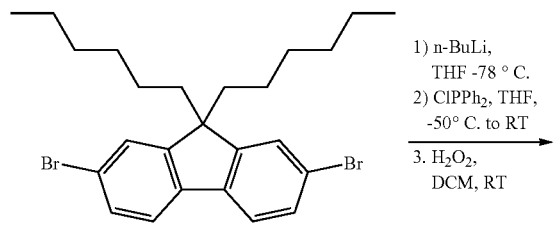

1) n-BuLi, THF -78 ° C.
2) ClPPh$_2$, THF, -50° C. to RT
3. H$_2$O$_2$, DCM, RT

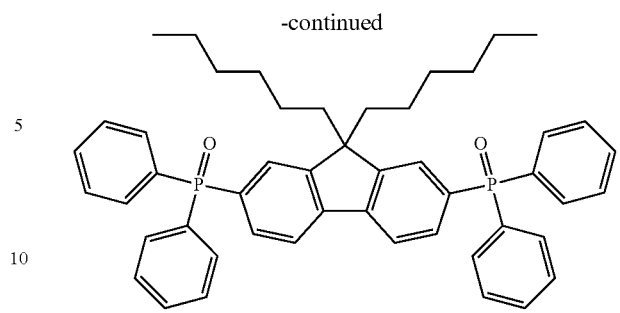

2,7-Dibromo-9,9-dihexylfluorene (5.00 g, 1.0 eq, 10.2 mmol) was placed in a flask and deaerated with argon. Then anhydrous THF (70 mL) was added, and the mixture was cooled to −78° C. 9.7 mL (2.5M solution in hexanes, 2.4 eq, 24.4 mmol) n-butyllithium were then added dropwise; the resulting solution was stirred for 1 h at −78° C., and then progressively warmed to −50° C. After slow addition of pure chlorodiphenylphosphine (4.0 mL, 2.2 eq, 22.4 mmol), the mixture was left to stir overnight till room temperature. MeOH (20 mL) was added to quench the reaction, and the solution was evaporated to dryness. The solid was re-dissolved in DCM (50 mL), $H_2O_2$ (30 wt % aqueous solution, 15 mL) was added dropwise, and the mi left under stirring. After 24 h, the organic phase was separated, washed subsequently with water and brine, dried over $MgSO_4$, and evaporated to dryness. Purification by chromatography (silica, gradient elution from hexane/EtOAc 1:1 v/v to neat EtOAc) provided the desired compound in 34% yield (2.51 g). The material was then further purified by vacuum sublimation.

The pure sublimed compound was amorphous, with no detectable melting peak on the DSC curve, and decomposed at 485° C.

DEVICE EXAMPLES

Comparative Example 1: (Blue OLED)

A first blue emitting device was made by depositing a 40 nm layer of HTM2 doped with PD2 (matrix to dopant weight ratio of 97:3 wt %) onto an ITO-glass substrate, followed by a 90 nm undoped layer of HTM1. Subsequently, a blue fluorescent emitting layer of ABH113 (Sun Fine Chemicals) doped with NUBD370 (Sun Fine Chemicals) (97:3 wt %) was deposited with a thickness of 20 nm. A 36 nm layer of the tested compound was deposited on the emitting layer together with the desired amount of the metallic element (usually, with 5 wt % Mg) as ETL. Subsequently, an aluminium layer with a thickness of 100 nm was deposited as a cathode.

The observed voltages and quantum efficiencies at a current density 10 mA/cm² are reported in the Table 1.

Comparative Example 2: (Organic Diode)

A similar device was produced as in Example 1, with the difference that the emitter was omitted, and each combination matrix-dopant was tested in two different thicknesses of the ETL (40 and 80 nm) and with two different dopant concentrations (5 and 25 wt %). The observed voltages at the current density 10 cm² and, wherever measured, optical absorbances of the device, are reported in the Table 2.

Comparative Example 3: (Blue or White OLED)

A similar device was produced as in Example 1, with the difference that there were combined various compositions of semiconducting materials in the ETL with various emitter systems. The results were evaluated similarly as in Example 1 and are summarized in Table 3.

Comparative Example 4: (Blue OLED)

In device of Example 1, Al cathode was replaced with the sputtered indium tin oxide (ITO) cathode in combination with the Mg or Ba doped ETL. The results showed that ETLs based on divalent metal doped phosphine oxide matrices having redox potentials vs Fc+/Fc in the range from −2.24 V to −2.81 V are applicable also in top emitting OLEDs with cathode made of transparent semiconductive oxide.

Comparative Example 5: (Transparent OLED))

In transparent devices having p-side (substrate with ITO anode, HTL, EBL) as in Example 1, and sputtered 100 nm thick ITO cathode as in Example 4, polymeric emitting layer comprising blue emitting polymer (supplied by Cambridge Display Technology) was successfully tested. The results reported in Table 4 (together with the n-side composition of the device, which in all cases comprised a 20 nm thick HBL consisting of F2 and ETL1 consisting of E2 and D3 in weight ratio 7:3 and having a thickness given in the table) show that ETLs based on phosphine oxide compounds doped with divalent metals are applicable even with polymeric LELs having very high LUMO levels about −2.8 V (in terms of their redox potential vs. Fc+/Fc reference). Without metal doped ETL, the devices had (at current density 10 mA/cm$^2$) very high voltages, even when EILs made of pure metal were deposited under the ITO electrode.

TABLE 4

| ETL1 (nm) | ETL2 (30 nm) | EIL | U (V) | EQE (%) | CIE1931x | CIE1931y |
|---|---|---|---|---|---|---|
| 20 | E2/Mg 8:2 | 5 nm Mg—Ag (9:1) | 4.2 | 1.6 | 0.16 | 0.11 |
| 10 | E2/Mg 9:1 | 5 nm Ba | 4.5 | 1.3 | 0.16 | 0.13 |
| 20 | E2/Mg 8:2 | 5 nm Al | 5.4 | 1.1 | 0.16 | 0.14 |
| 5 | E2/Ba 8:2 | — | 4.6 | 1.3 | 0.16 | 0.18 |
| 20 | — | 5 nm Mg—Ag (9:1) | 7.5 | 1.8 | 0.17 | 0.22 |
| 10 | — | 5 nm Ba | 6.4 | 2.2 | 0.10 | 0.13 |

Comparative Example 6: (Metal Deposition Using Linear Vaporization Source)

Evaporation behaviour of Mg in a linear evaporation source was tested. It was demonstrated that Mg can be deposited from linear sources with the rate as high as 1 nm/s without spitting, whereas point evaporation sources spit Mg particles at the same deposition rate significantly.

Comparative Example 7: (Metal+Metal Salt Electrical Doping in the Same ETL)

Mixed ETL comprising a matrix combined with LiQ+ either Mg or W$_2$(hpp)$_4$ a combined two-component doping system showed the superiority of the salt+metal combination.

Comparative Example 8: (Tandem White OLED)

On an ITO substrate, following layers were deposited by vacuum thermal evaporation:
10 nm thick HTL consisting of 92 wt % auxiliary material F4 doped with 8 wt % PD2, 135 nm thick layer of neat F4, 25 nm thick blue emitting layer ABH113 (Sun Fine Chemicals) doped with NUBD370 (Sun Fine Chemicals) (97:3 wt %), 20 nm thick layer ABH036 (Sun Fine Chemicals), 10 nm thick CGL consisting of 95 wt % compound E12 doped with 5 wt % Mg, 10 nm thick HTL consisting of 90 wt % auxiliary material F4 doped with 10 wt % PD2, 30 nm thick layer of neat F4, 15 nm thick layer of neat F3, 30 nm thick propriet phosphorescent yellow emitting layer, 35 nm thick ETL of auxiliary material F5, 1 nm thick LiF layer and aluminum cathode. The diode operated at 6.81 V had EQE 24.4%.

Comparative Example 9: (Tandem White OLED)

The example 8 was repeated with Yb in the CGL instead of Mg. The diode operated at 6.80 V had EQE 23.9%.

Comparative Example 10: (Tandem White OLED)

The example 9 was repeated with compound E6 instead of E12 in the CGL. The diode operated at 6.71 V had EQE 23.7%.

Inventive and Comparative Example 11 (Charge Injection into Adjacent or Admixed High-LUMO ETM in a Blue OLED)

Example 1 was repeated with following modifications:
On the ITO substrate, 10 nm thick HTL consisting of 92 wt % auxiliary material F4 doped with 8 wt % PD2 followed by 130 nm thick layer of neat F4 were deposited by VTE. On top of the same emitting layer as in example 1, a 31 nm thick HBL of F6 and on top of it the doped ETL according to Table 5 were deposited subsequently, followed with the aluminium cathode. All deposition steps were done by VTE under pressure below 10$^{-2}$ Pa.

TABLE 5

| ETM | $E_0$ V | Mg 36 nm ETM:Mg(95:5) V at 10 mA/cm$^2$ | Yb 36 nm ETM:Yb(95:5) V at 10 mA/cm$^2$ | Ba 36 nm ETM:Ba(95:5) V at 10 mA/cm$^2$ | Li 36 nm ETM:Li(99,5:0,5) V at 10 mA/cm$^2$ |
|---|---|---|---|---|---|
| E5 | −2.58 | 4.2 | 3.7 | | |
| E6 | −2.62 | 6.1 | 3.5 | | |
| E7 | −2.81 | >5.2 | 3.7 | | |
| E13 | −2.78 | 3.9 | 3.2 | 3.2 | 3.4 |
| E14 | −2.71 | | 3.3 | | |
| A2 | <−3.10 | 3.9 | 3.9 | 3.3 | |

TABLE 5-continued

| ETM | $E_0$ V | Mg 36 nm ETM:Mg(95:5) V at 10 mA/cm$^2$ | Yb 36 nm ETM:Yb(95:5) V at 10 mA/cm$^2$ | Ba 36 nm ETM:Ba(95:5) V at 10 mA/cm$^2$ | Li 36 nm ETM:Li(99,5:0,5) V at 10 mA/cm$^2$ |
|---|---|---|---|---|---|
| A4 | <−3.10 | 4.1 | 3.2 | | |
| A2:F6 | <−3.10:−2.63 | | 3.3 | 3.3 | |
| A2:B10 | <−3.10:−2.91 | | 3.9 | 3.7 | |
| C11 | −2.45 | >10.0 | 5.9 | | 5.3 |

The experiments convincingly showed that compounds A2 and A4 and their mixtures with ETMs which are free of a polar group provided equally good electron injection as more complex and significantly more expensive ETMs specifically designed to combine the presence of the polar group and of a conjugated system of at least 10 delocalized electrons in one molecule. Due to highly negative reduction potential and low polarity of the F6 layer, the model device mimicks also the properties of devices comprising emitting layers made of light emitting polymers.

TABLE 6

| ETM | $E_0$ V | Ba 36 nm ETM:Ba(95:5) V at 10 mA/cm$^2$ | Yb 36 nm ETM:Yb(95:5) V at 10 mA/cm$^2$ | Yb (EIL) 2-5 nm ETM:Yb(95:5) V at 10 mA/cm$^2$ | Ba (EIL) 2 nm ETM:Ba(95:5) V at 10 mA/cm$^2$ |
|---|---|---|---|---|---|
| E5 | −2.58 | | | | |
| E6 | −2.62 | | | 8.1 | |
| E7 | −2.81 | | | | |
| E13 | −2.78 | | | 5.4 | |
| A2 | <−3.10 | 5.6 | | 6.8 | 5.9 |
| A4 | <−3.10 | | | | |
| A2:F6 | <−3.10:−2.63 | 7.1 | 7 | | |
| A2:B10 | <−3.10:−2.91 | 6.9 | 7.1 | | |

The results showed that the inventive semiconducting material allows an efficient electron injection also into a CBP layer having even more negative redox potential than the HBL matrix of the previous example.

Inventive and Comparative Example 13
(Applicability of Inventive Semiconducting Materials in Very Thick ETLs)

Example 11 was repeated with ETLs having thickness 150 nm. The results are shown in Table 7.

TABLE 7

| ETM | $E_0$ V | Mg 150 nm ETM:Mg(95:5) V at 10 mA/cm$^2$ | Yb 150 nm ETM:Yb(95:5) V at 10 mA/cm$^2$ | Ba 150 nm ETM:Yb(95:5) | Li 150 nm ETM:Li(99,5:0,5) V at 10 mA/cm$^2$ |
|---|---|---|---|---|---|
| E5 | −2.58 | | | | |
| E6 | −2.62 | 7.50 | 3.6 | | |
| E7 | −2.81 | | | | |
| E13 | −2.78 | | 3.3 | 3.2 | 3.4 |
| E14 | −2.71 | | 3.3 | | |
| A2 | <−3.10 | | 3.8 | | |
| A4 | <−3.10 | | 3.5 | | |
| A2:F6 | <−3.10:−2.63 | | 3.3 | | |
| A2:B10 | <−3.10:−2.91 | | 4.8 | | |
| C11 | −2.45 | | | | 5.2 |

Inventive and Comparative Example 12 (Charge Injection into Adjacent or Admixed High-LUMO ETM in a Blue OLED)

Example 11 was repeated under replacement F6 in HBL with B10. Composition of ETLs and results are shown in Table 6.

Comparison with Table 5 demonstrates that devices utilizing in ETLs the inventive materials comprising compounds A2 and A4 show practically the same operational voltages as devices of Example 11, despite the thickness of the ETL increased more than four times. The excellent electron injection and resulting high conductivity of in semiconducting materials of the present injection thus enables tuning the size of optical cavity in electronic devices comprising emitting layers with very negative redox potentials, like light emitting polymers.

The features disclosed in the foregoing description, in the claims and in the accompanying drawings may both separately and in any combination be material for realizing the invention in diverse forms thereof. Reference values of physico-chemical properties relevant for the present invention (first and second ionization potential, normal boiling point, standard redox potential) are summarized in Table 8.

TABLE 8

| Element | $I_p^I$ eV [2] | $I_p^{II}$ eV [2] | $\Sigma I_p^{I-II}$ eV [2] | b.p.[1] °C. | $E^0$ V |
|---|---|---|---|---|---|
| Li | 5.391 | 75.640 | 81.031 | 1330 | −3.04 |
| Na | 5.139 | 47.286 | 52.425 | 890 | −2.713 |
| Mg | 7.646 | 15.035 | 22.681 | 1110 | −2.372 |
| Al | 5.986 | 18.829 | 24.815 | 2470 | −1.676 |
| Ca | 6.113 | 11.872 | 17.985 | 1487 | −2.84 |
| Mn | 7.434 | 15.640 | 23.074 | 2100 | −1.18 |
| Zn | 9.394 | 17.964 | 27.358 | 907 | −0.793 |
| Sr | 5.695 | 11.030 | 16.725 | 1380 | −2.89 |
| Ba | 5.212 | 10.004 | 15.216 | 1637 | −2.92 |
| Sm | 5.644 | 11.07 | 16.714 | 1900 | ** |
| Eu | 5.670 | 11.241 | 16.911 | 1440 | −1.99 |
| Yb | 6.254 | 12.176 | 18.430 | 1430 | −2.22 |
| Bi | 7.286 | 16.69 | 23.976 | 1560 | 0.317 |

[1]Yiming Zhang, Julian R. G. Evans, Shoufeng Yang: Corrected Values for Boiling Points and Enthalpies of Vaporization of Elements in Handbooks. From: Journal of Chemical & Engineering Data. 56, 2011, p. 328-337; the values fit with values given in articles for individual elements in current German version of Wikipedia.
[2]http://en.wikipedia.org/wiki/Ionization_energies_of_the_elements_%28data_page%29

USED ABBREVIATIONS

CGL charge generating layer
CV cyclic voltammetry
DCM dichloromethane
DSC differential scanning calorimetry
EIL electron injecting layer
EQE external quantum efficiency of electroluminescence
ETL electron transporting layer
ETM electron transport matrix
EtOAc ethyl acetate
Fc⁺/Fc ferrocenium ferrocene reference system
h hour
hole injecting layer
HOMO highest occupied molecular orbital
HTL hole transporting layer
HTM hole transport matrix
ITO indium tin oxide
LUMO lowest unoccupied molecular orbital
LEL light emitting layer
LiQ lithium 8-hydroxyquinolinolate
MeOH methanol
mol % molar percent
OLED organic light emitting diode
QA quality assurance
RT room temperature
tetrahydrofuran
UV ultraviolet (light)
vol % volume percent
v/v volume/volume (ratio)
VTE vacuum thermal evaporation
wt % weight (mass) percent

The invention claimed is:

1. Semiconducting material comprising
    (i) in substantially elemental form, an electropositive element selected from alkali metals, alkaline earth metals, rare earth metals, or transition metals of the fourth period of the Periodic table having proton numbers 22, 23, 24, 25, 26, 27, 28, 29, and
    (ii) at least one first, compound which is a compound comprising at least one polar group selected from phosphine oxide group or diazole group, wherein
    the first compound is a substantially covalent compound which is free of a conjugated system of delocalized electrons or comprises a conjugated system of delocalized electrons having less than 10 conjugated delocalized electrons, and the reduction potential of the first compound, if measured by cyclic voltammetry, under the same conditions has the value which is more negative than the value obtained for at least one of tris(2-benzo[d]thiazo-2-yl)phenoxyaluminum, 9,9',10,10'-tetraphenyl-2,2'-bianthracene, 2,9-di([1,1'-biphenyl]-4-yl)-4,7-diphenyl-1,10-phenanthroline, 2,4,7,9-tetraphenyl-1,10-phenanthroline, 9,10-di(naphthalen-2-yl)-2-phenylanthracene, 2,9-bis(2-methoxyphenyl)-4,7-diphenyl-1,10-phenanthroline, [fluorene]-2,7-diylbis(diphenylphosphine oxide), 4,7-diphenyl-1,10-phenanthroline, 1,3,5-tris(1-phenyl-1H-benzimidazol-2-yl)benzene, pyrene, [1,1'-binaphthalen]-2,2'-diylbis(diphenylphosphine oxide).

2. Semiconducting material according to claim 1, further comprising at least one second compound, wherein the second compound is a substantially covalent compound which comprises a conjugated system of at least ten delocalized electrons.

3. Semiconducting material according to claim 2, wherein the reduction potential of the second compound, when measured by cyclic voltammetry, under the same conditions has the value which is more negative than for at least one of tris(2-benzo[d]thiazol-2-yl)phenoxyaluminum, 9,9',10,10'-tetraphenyl-2,2'-bianthracene, or 2,9-di([1,1'-biphenyl]-4-yl)-4,7-diphenyl-1,10-phenanthroline, 2,4,7,9-tetraphenyl-1,10-phenanthroline, 9,10-di(naphthalen-2-yl)-2-phenylanthracene, 2,9-bis(2-methoxyphenyl)-4,7-diphenyl-1,10-phenanthroline, 9,9'-spirobi[fluorene]-2,7-diylbis(diphenylphosphine oxide), 4,7-diphenyl-1,10-phenanthroline, 1,3,5-tris(1-phenyl-1H-benzimidazol-2-yl)benzene, pyrene, or [1,1'-binaphthalen]-2,2'-diylbis(diphenylphosphine oxide).

4. Semiconducting material according to claim 2, wherein the conjugated system of at least 10 delocalized electrons is comprised in a $C_{14}$-$C_{50}$-arene or $C_8$-$C_{50}$ heteroarene structural moiety.

5. Semiconducting material according to claim 1, wherein the at least one first compound contains at least one aromatic or heteroaromatic ring.

6. Semiconducting material according to claim 5, wherein the at least one first compound comprises at least two aromatic or heteroaromatic rings which are either linked by a covalent bond or condensed.

7. Semiconducting material according to claim 1, wherein the electropositive element is selected from Li, Na, K, Mg, Ca, Sr, Ba, Sm, Eu, Yb, or Mn.

8. Semiconducting material according to claim 1, wherein the molar ratio of the electropositive element to the first compound is lower than 0.5.

9. Semiconducting material according to claim 1, wherein the molar ratio of the electropositive element to the first compound is higher than 0.01.

10. Semiconducting material according, to claim 1, wherein the first compound has the structure according to formula (I)

$$A^1\text{-}Q\text{-}A^2 \quad (I),$$

wherein $A^1$ and $A^2$ are polar groups independently selected from a phosphine oxide group or a diazole group, and Q is a direct bond or a spacer consisting of up to 100 covalently bound atoms, which does not comprise a conjugated system of delocalized electrons.

11. Semiconducting material according to claim 10, wherein Q is an oligomethylene spacer having formula (II)

$$-(CH_2)_x- \quad (II),$$

wherein x is an integer equal 1, 2, 3 or 4.

12. Semiconducting material according to claim 1, wherein the phosphine oxide polar group is selected from phosphine oxide substituted with two monovalent hydrocarbyl groups or one divalent hydrocarbylene group forming with the phosphorus atom a ring, and the overall count of carbon atoms in the hydrocarbyl groups or in the hydrocarbylene group is 2-60.

13. Semiconducting material according to claim 1, wherein the diazole polar group is an imidazole group.

14. Semiconducting material according to claim 1, further comprising a metal salt additive consisting of at least one metal cation and at least one anion.

15. Semiconducting material according to claim 14, wherein the metal cation is $Li^+$ or $Mg^{2+}$.

16. Semiconducting material according to claim 14, wherein the metal salt additive is selected from metal complexes comprising a 5-, 6- or 7-membered ring that contains a nitrogen atom and an oxygen atom attached to the metal cation or from complexes having the structure according to formula (II)

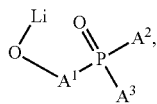

Formula (II)

wherein $A^1$ is a $C_6$-$C_{30}$ arylene or $C_2$-$C_{30}$ heteroarylene comprising at least one atom selected from O, S, or N in an aromatic ring and each of $A^2$ and $A^3$ is independently selected from a $C_6$-$C_{30}$ aryl or $C_2$-$C_{30}$ heteroaryl comprising at least one atom selected from O, S, or N in an aromatic ring.

17. Semiconducting material according to claim 14, wherein the anion is selected from the group consisting of phenolate substituted with a phosphine oxide group, 8-hydroxyquinolinolate, and pyrazolylborate.

18. Process for manufacturing the semiconducting material defined in claim 1, comprising a step wherein (i) an electropositive element selected from alkali metals, alkaline earth metals, rare earth metals, or transition metals of the fourth period of the Periodic table having proton numbers 22, 23, 24, 25, 26, 27, 28, 29, and (ii) at least one first compound which is a compound comprising at least one polar group selected from phosphine oxide group or diazole group, wherein the first compound is a substantially covalent compound which is free of a conjugated system of delocalized electrons or comprises a conjugated system of delocalized electrons having less than 10 conjugated delocalized electrons, and the reduction potential of the organic compound, if measured by cyclic voltammetry, under the same conditions, has the value which is more negative than the value obtained for at least one of tris(2-benzo[d]thiazol-2-yl)phenoxyaluminum, 9,9',10,10'-tetraphenyl-2,2'-bianthracene, 2,9-di([1,1'-biphenyl]-4-yl)-4,7-diphenyl-1,10-phenanthroline, tetraphenyl-1,10-phenanthroline, 9,10-di(naphthalen-2-yl)-2-phenylanthracene, 2,9-bis(2-methoxyphenyl)-4,7-diphenyl-1,10-phenanthroline, 9,9'-spirobi[fluorene]-2,7-diylbis(diphenylphosphine oxide), 4,7-diphenyl-1,10-phenanthroline, 1,3,5-tris(1-phenyl-1H-benzimidazol-2-yl)benzene, pyrene, or [1,1'-binaphthalen]-2,2'-diylbis(diphenylphosphine oxide), are coevaporated and codeposited under reduced pressure, the electropositive element being deposited in an elemental or substantially elemental form.

19. Process according to claim 18, wherein the electropositive element is evaporated from its elemental or substantially elemental form.

20. Process according to claim 18, wherein the electropositive element is selected from Li, Na, K, Mg, Ca, Sr, Ba, Sm, Eu, Tm Yb, or Mn.

21. Electronic device according to claim 20, further comprising at least one light emitting layer between the anode and the cathode.

22. Electronic device according to claim 21, wherein the light emitting layer consists of compounds that have their reduction potentials, if measured by cyclic voltammetry, under the same conditions more negative than the second compound as defined in the semiconducting material according to claim 2.

23. Electronic device according to claim 21, wherein the light emitting layer comprises a light emitting polymer.

24. Electronic device according to claim 21, wherein the light emitting layer is adjacent to the electron injecting or electron transporting layer.

25. Electronic device according to claim 21, wherein the light emitting layer emits blue or white light.

26. Electronic device according to claim 21, wherein the cathode is a transparent conductive oxide cathode.

27. Electronic device according to claim 21, which is a tandem OLED stack.

28. Electronic device comprising a cathode, an anode and the semiconducting material according to claim 1 between the cathode and the anode.

29. Electronic device according to claim 28, wherein the semiconducting material according to claim 1 is comprised in an electron transporting, electron injecting, or charge generating layer.

30. Electronic device according to claim 29, wherein the electro transporting or electron injecting layer is thicker than 5 nm.

* * * * *